United States Patent
Ludwig

(10) Patent No.: US 8,324,555 B2
(45) Date of Patent: Dec. 4, 2012

(54) NANOELECTRONIC DIFFERENTIAL AMPLIFIERS AND RELATED CIRCUITS IMPLEMENTED ON A SEGMENT OF A GRAPHENE NANORIBBON

(75) Inventor: Lester F. Ludwig, Belmont, CA (US)

(73) Assignee: Pike Group LLC, Dover, DE (US)

( * ) Notice: Subject to any disclaimer, the term of this patent is extended or adjusted under 35 U.S.C. 154(b) by 0 days.

(21) Appl. No.: 13/217,240

(22) Filed: Aug. 25, 2011

(65) Prior Publication Data

US 2012/0001689 A1   Jan. 5, 2012

Related U.S. Application Data

(63) Continuation of application No. 12/948,107, filed on Nov. 17, 2010, now Pat. No. 8,013,286, which is a continuation of application No. 12/033,212, filed on Feb. 19, 2008, now Pat. No. 7,838,809.

(60) Provisional application No. 60/901,878, filed on Feb. 17, 2007.

(51) Int. Cl.
*H03F 3/45* (2006.01)
*H01L 21/28* (2006.01)
*B82Y 40/00* (2011.01)

(52) U.S. Cl. .............. 250/214 A; 330/252; 330/253; 330/277; 977/734; 977/953

(58) Field of Classification Search .............. 250/214 C, 250/214 R, 208.1, 214 A; 257/414, 288, 257/401, 253; 330/253, 277, 252; 977/953, 977/734, 755
See application file for complete search history.

(56) References Cited

U.S. PATENT DOCUMENTS

| | | | |
|---|---|---|---|
| 6,781,166 B2 * | 8/2004 | Lieber et al. | 257/211 |
| 6,962,839 B2 | 11/2005 | Wei et al. | |
| 6,982,903 B2 | 1/2006 | Bertin et al. | |
| 7,015,142 B2 * | 3/2006 | DeHeer et al. | 438/689 |
| 7,025,652 B2 | 4/2006 | Heo et al. | |
| 7,129,554 B2 * | 10/2006 | Lieber et al. | 257/414 |
| 7,145,824 B2 | 12/2006 | Bill et al. | |
| 7,148,462 B2 * | 12/2006 | Bock | 250/214 R |
| 7,256,466 B2 * | 8/2007 | Lieber et al. | 257/414 |
| 7,330,709 B2 | 2/2008 | Bertin | |
| 7,385,267 B2 * | 6/2008 | Lieber et al. | 257/414 |
| 7,412,428 B2 | 8/2008 | Nugent | |

(Continued)

OTHER PUBLICATIONS

Z. Chen et. al., "An Integrated Logic Circuit Assembled on a Single Carbon Nanotube," Science, Mar. 24, 2006, vol. 311, pp. 1735.

(Continued)

*Primary Examiner* — John Lee

(57) ABSTRACT

A multiple transistor differential amplifier is implemented on a segment of a single graphene nanoribbon. Differential amplifier field effect transistors are formed on the graphene nanoribbon from a first group of electrical conductors in contact with the graphene nanoribbon and a second group of electrical conductors insulated from, but exerting electric fields on, the graphene nanoribbon thereby forming the gates of the field effect transistors. A transistor in one portion of the graphene nanoribbon and a transistor in another portion of the graphene nanoribbon are responsive to respective incoming electrical signals. A current source, also formed on the graphene nanoribbon, is connected with the differential amplifier, and the current source and the differential amplifier operating together generate an outgoing signal responsive to the incoming electrical signal. In an example application, the resulting circuit can be used to interface with electrical signals of nanoscale sensors and actuators.

26 Claims, 27 Drawing Sheets

U.S. PATENT DOCUMENTS

| | | | |
|---|---|---|---|
| 7,420,396 | B2 | 9/2008 | Nugent |
| 7,426,501 | B2 | 9/2008 | Nugent |
| 7,436,033 | B2 | 10/2008 | Park et al. |
| 7,439,562 | B2 | 10/2008 | Auvray et al. |
| 7,452,759 | B2 | 11/2008 | Sandhu |
| 7,456,625 | B2 | 11/2008 | Kimura et al. |
| 7,473,943 | B2 | 1/2009 | Mostarshed et al. |
| 7,521,292 | B2 * | 4/2009 | Rogers et al. ............... 438/118 |
| 7,538,337 | B2 | 5/2009 | Hijzen et al. |
| 7,733,479 | B2 * | 6/2010 | Shew et al. ................ 356/244 |
| 7,799,699 | B2 * | 9/2010 | Nuzzo et al. ................ 438/758 |
| 7,838,809 | B2 | 11/2010 | Ludwig |
| 7,858,918 | B2 | 12/2010 | Ludwig |
| 8,013,286 | B2 * | 9/2011 | Ludwig ................. 250/214 A |
| 2002/0001905 | A1 | 1/2002 | Choi et al. |
| 2003/0042406 | A1 | 3/2003 | Charbon |
| 2004/0153426 | A1 | 8/2004 | Nugent |
| 2004/0162796 | A1 | 8/2004 | Nugent |
| 2004/0178849 | A1 | 9/2004 | Kimura |
| 2004/0193558 | A1 | 9/2004 | Nugent |
| 2005/0015351 | A1 | 1/2005 | Nugent |
| 2005/0036905 | A1 | 2/2005 | Gokturk |
| 2005/0052894 | A1 | 3/2005 | Segal et al. |
| 2005/0111283 | A1 | 5/2005 | Kimura et al. |
| 2005/0168905 | A1 | 8/2005 | Kimura |
| 2006/0044044 | A1 | 3/2006 | Kimura et al. |
| 2006/0065887 | A1 | 3/2006 | Tiano et al. |
| 2006/0175601 | A1 * | 8/2006 | Lieber et al. ................. 257/19 |
| 2007/0126668 | A1 | 6/2007 | Kimura |
| 2007/0187729 | A1 | 8/2007 | Park et al. |
| 2007/0262397 | A1 | 11/2007 | Surdeanu et al. |
| 2007/0278388 | A1 | 12/2007 | Hirose et al. |
| 2007/0285843 | A1 | 12/2007 | Tran |
| 2008/0119016 | A1 | 5/2008 | Dubin et al. |
| 2008/0121996 | A1 | 5/2008 | Park et al. |
| 2008/0135892 | A1 | 6/2008 | Finnie |
| 2008/0159042 | A1 | 7/2008 | Bertin et al. |
| 2008/0170169 | A1 | 7/2008 | Kimura et al. |
| 2008/0231361 | A1 | 9/2008 | Ludwig |
| 2008/0290941 | A1 | 11/2008 | Ludwig |
| 2009/0014803 | A1 | 1/2009 | Zhu |
| 2009/0072223 | A1 | 3/2009 | Awano |
| 2009/0072907 | A1 | 3/2009 | Kimura et al. |
| 2009/0084944 | A1 | 4/2009 | Hirose et al. |
| 2009/0200541 | A1 | 8/2009 | Herman et al. |
| 2010/0178722 | A1 | 7/2010 | de Graff et al. |
| 2010/0214034 | A1 | 8/2010 | Peng et al. |
| 2010/0306726 | A1 | 12/2010 | Ludwig |
| 2011/0062313 | A1 | 3/2011 | Ludwig |
| 2011/0062418 | A1 | 3/2011 | Ludwig |
| 2011/0296363 | A1 * | 12/2011 | Ludwig ........................ 716/119 |
| 2012/0001689 | A1 * | 1/2012 | Ludwig ........................ 330/252 |

OTHER PUBLICATIONS

R. Martel et al., "Single- and multi-wall carbon nanotube field-effect transistors," Applied Physics Letters, vol. 73 No. 17, Oct. 26, 1998, pp. 2447-2449.

Bachtold, A., Hadley, P., Nakanishi, T. and Dekker, C., "Logic Circuits with Carbon Nanotube Transistors," Science, vol. 294, No. Nov. 9, 2001, pp. 1317-1320.

Bethany Raiford, "Graphene Ribbons," Chemical and Engineering News, vol. 85, No. 4, Jan. 28, 2008, p. 15.

Gojman, B., Hsin, H., Liang, J., Nezhdanova, N. and Saini, Jasmin, "Y-Junction Carbon Nanotube Implementation of Intramolecular Electronic Nand Gate," Aug. 13, 2004, pp. 1-24.

Goldsmith et al., "Conductance-Controlled Point Functionalization of Single-Walled Carbon Nanotubes," Science, Jan. 5, 2007, vol. 315. No. 5808, pp. 77-81.

Siripruchyanan, M. and Jaikla, W., "Floating Capacitance Multiplier Using DVCC and CCCIIs," ISCIT '07 International Symposium on Communications and Information Technologies, Oct. 17-19, 2007, Sydney, pp. 218-221.

J. Han, X. Liu, C. Lee, C. Zhou, "Carbon nanotube field-effect inverters," Applied Physics Letters, vol. 79 No. 20, Nov. 12, 2001, pp. 3329-3331.

"Bell Labs Scientists Usher in New Era of Molecular-Scale Electronics," Space Daily: your portal to space, Oct. 17, 2001, 2 pages.

V. Derycke, R. Martel, J. Appenzeller, Ph. Avouris, "Carbon Nanotube Inter-and Intramolecular Logic Gates," Nano Letters, Aug. 16, 2001, 4 pages.

Richardson, W. H., "Analysis of Carbon Nanotube Intramolecular p-n Tunnel Junction Transistors," 2003 Third IEEE Conference on Nanotechnology, 2003, pp. 753-755.

Sachdev, C., "Nanotube Kinks Control Current," Technology Research News, 2 pages, (Sep. 2001).

Will Knight, "Y-shaped Nanotubes are Ready-made Transistors," NewScientist.com, Jan. 29, 2007, available at http://www.newscientist.com/article.ns?id=dn7847, 2 pages.

Petchakit, W. and Petchakit, S., "New Floating Capacitance Multipliers," Proceedings of 28th Electrical Engineering Conference (EECON-28), vol. 2, Phuket, Thailand, pp. 1233-1236, 2005.

"Nanotube diode proves multifunctional," General Electric Global Research, Jul. 13, 2004, reported in http://nanotechweb.org/cws/article/tech/19870, 2 pages.

Ji Ung Lee, Photovoltaic effect in ideal carbon nanotube diodes,: Applied Physics Letters 87, 073101, 2005, 3 pages.

* cited by examiner

US 8,324,555 B2

NANOELECTRONIC DIFFERENTIAL AMPLIFIERS AND RELATED CIRCUITS IMPLEMENTED ON A SEGMENT OF A GRAPHENE NANORIBBON

CROSS-REFERENCE TO RELATED APPLICATIONS

This application is a continuation of U.S. patent application Ser. No. 12/948,107, filed on Nov. 17, 2010, which is a continuation of U.S. patent application Ser. No. 12/033,212, now U.S. Pat. No. 7,838,809, filed on Feb. 19, 2008 and issued on Nov. 23, 2010, and pursuant to 35 U.S.C. §119(e), claiming benefit of priority from provisional patent application Ser. No. 60/901,878, filed Feb. 17, 2007, the contents of which are incorporated by reference in their entirety.

BACKGROUND OF THE INVENTION

1. Field of the Invention

The present invention generally relates to nanotechnology, and in particular, to differential amplifiers and associated circuits created from carbon nanotubes, graphene nanoribbons and other related materials, and the associated use and synergies of these with carbon nanotube sensors.

2. Background of the Invention

Since Surnio Iijima's discovery of (multiwall) carbon nanotubes in 1991, which is based on the Buckminsterfullerene ($C_{60}$) by Richard Smalley and team, the subsequent 1993 discoveries of single-wall carbon nanotubes by a number of separate research groups, and the first studies of the electrical properties of these, carbon lattices have been rapidly risen to a position to form a new platform for electronics in a manner that gracefully inherits the accumulated quantum theory and design conceptualizations of the now well-entrenched semiconductor dogmas and methodologies. Although other types of molecular electronic materials, substrates, and methods await study and development, carbon nanotube electronics has captured considerable funding support and scientific research attention. Further, in being carbon-based, there is the potential for future leverage of carbon-based electronics in deep and profound ways with carbon-based organic and bioorganic chemical processes.

SUMMARY OF THE INVENTION

Features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In accordance with an embodiment, small-signal and other circuit design techniques may be realized by graphene nanoribbon field-effect transistors to create analog electronics for analog signal handling, analog signal processing, and conversions between analog signals and digital signals. As the graphene nanoribbon field-effect transistors exist and operate at nanoscale, they can be readily collocated or integrated into graphene nanoribbon sensing and transducing systems. Such collocation and integration is at, or adequately near, nanoscale.

These and other embodiments will also become readily apparent to those skilled in the art from the following detailed description of the embodiments having reference to the attached figures, the invention not being limited to any particular embodiment disclosed.

BRIEF DESCRIPTION OF THE DRAWINGS

The above and other aspects, features, and advantages of the present invention will become more apparent upon consideration of the following description of preferred embodiments, taken in conjunction with the accompanying drawing figures.

FIGS. 7a and 7b depict an exemplary three carbon nanotube segment of the differential amplifier circuit of FIG. 5a.

DETAILED DESCRIPTION OF THE PREFERRED EMBODIMENTS

Figure 1A:
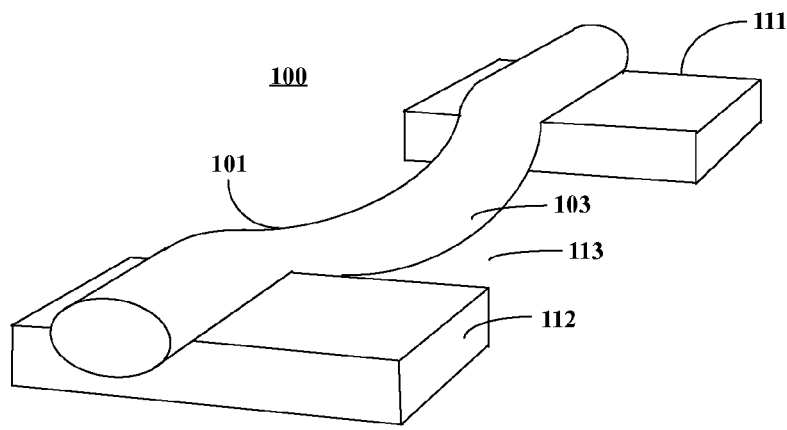
FIGS. 1a and 1b depict exemplary fabrication of an N-type carbon nanotube field effect transistor ("CFFET").

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

Contemporary carbon nanotube (and graphene) electronics has provided both N-channel and P-channel field-effect transistors with promises of other future junction, tunneling, magnetic, and spintronic active devices. Carbon nanotube structures are also known for light emitting structures, nanoscale electromechanical transducers, nanoscale electromechanical relays, light sensing structures, and a wide variety of nanoscale phenomenological sensing devices. A wide range of experimentally observed phenomena and initial engineering is being cataloged daily, and early conceptualizations and studies of commercially-viable fabrication techniques are often co-proposed with these findings and offerings.

Carbon nanotubes comprise a somewhat broad class of materials. In the organic chemistry and biochemistry found throughout nature, carbon atoms ready link themselves in chains and rings involving one (as in alkanes such as methane), two (as in alkenes such as ethane), or even three (as in alkynes such as ethyne) of their four covalent bonds. Carbon can also link all four bonds with itself, occurring naturally in the long-known 3-dimensional lattice forms (allotropes) of diamonds and graphite and more recently (and perhaps less prevalent in Nature) 2-dimensional lattice form of graphene. Graphene lattices may be arranged in 3-dimensional shapings of their 2-dimensional lattice so that the sheet's "edges" seamlessly connect to themselves to form spheroids (fullerenes), tubes (carbon nanotubes), and cones (carbon nanohorns).

In the case of tubes, the "joining" of the edges of the graphene sheet may be straight-across to result in materials that electrically behave as metals, or made at various angles to cause a twisting (thought of geometrically as helicity, and chemically as chirality) to result in materials that electrically behave as semiconductors. Additionally, carbon nanotubes, as mentioned earlier, may be created in single-wall and multiwall varieties. Of the wide range of devices crafted from carbon nanotubes, many involve constraints as to the number of walls (at least single-wall versus multiple-wall) and type of helicity/chirality (usually at least metal versus semiconductor).

As a first observation, given the small size of carbon nanotubes it is highly likely that a given commercially-fabricated substrate will be most commercially-viable if a single type of carbon nanotube material is employed.

Further, in the case of carbon nanotube sensors and transducers, conventional consideration to interfacing to the larger-scale world of exogenous signal processing and control systems that would co-operate with these miraculous small devices is virtually or completely non-existent. One advantage of nanoscale molecular electronics (including carbon nanotube electronics) is that the degradation of signals and measurements due to thermal and other electrical noise is highly reduced due in part to the smaller electron counts involved in nanoscale electronic device operation. With poor interfacing to the larger-scale world, the valuable gifts and opportunities offered by the sensitivities and signal integrity of these nanoscale devices is easily (and perhaps literally) would otherwise be lost in the noise.

Thus, as a second observation, recognized benefits relate to signal conditioning, signal processing, and control electronics that are compatible with and complementary to the signal integrity of carbon nanotube sensors and transducers. In some circumstances such signal conditioning, signal processing, and control electronics would be purposed to work only with nanoscale devices. In other circumstances such signal conditioning, signal processing, and control electronics would provide high-integrity interfacing between nanoscale devices and the larger-scale world of exogenous systems.

Thus there is a need for signal conditioning and signal processing that is compatible with and complementary to the signal integrity of carbon nanotube sensors and transducers. In some circumstances such as signal conditioning, signal processing, and control electronics would provide high-integrity interfacing between nanoscale devices and the larger-scale world of exogenous systems. In other circumstances the signal conditioning and signal processing electronics may be implemented to work only with other nanoscale devices.

In accordance with various embodiments, features relating to the first and second observations may be implemented to combine carbon nanotube sensors and transducers with nanoscale molecular electronics, and to the extent possible use the same type of carbon nanotube material for both.

Further as to the desirable requirements for this, many of the devised and proposed carbon nanotube sensors, and some proposed carbon nanotube transducers, utilize signals whose voltage and/or current vary over what amounts to a continuous range (or at least a large number) of values, that is, they involve analog signals. It is understood that the present disclosure is not limited to carbon nanotube electronic circuits which focus on logic circuitry (i.e., binary-values or digital signals).

Thus as a third observation, in accordance with embodiments of the present invention, the above described nanoscale molecular electronics made be formed using compatible material as possible to additionally include high-quality analog signal handling and analog signal processing capabilities. In some circumstances only analog signal handling and signal processing will be involved. In other circumstances, analog signals must be converted to (and/or from) digital signals.

Embodiments of the present invention provide a number of benefits. For instance, field-effect transistors may be readily crafted from at least single-wall carbon nanotubes ("SWCN") and to some extent multi-wall carbon nanotubes ("MWCN") as is explained in "Single- and Multi-Wall Carbon Nanotube Field-Effect Transistors" R., Martel et al., Applied Physics Letters, Vol. 73 No. 17, Oct. 26, 1998 and many subsequent works known to those skilled in the art. Further, such field-effect transistors ("FETs") operate in both classical enhancement and depletion modes, for example exhibiting typical (for example "square-law") voltage-current characteristics associated with common junction FETs ("JFETs") and metal-oxide semiconductor FETs ("MOSFETs") used for many years in discrete and monolithic electronics of both analog and digital varieties. Further, it is known that carbon nanotube field-effect transistors can carry very high currents relative to their size (large integer multiples to that of silicon and in some cases even copper wire).

Nonetheless, it is conventionally understood that carbon nanotube electronic circuits are implemented with a focus on logic circuitry (i.e., all signals are binary-valued digital signals). However, most known carbon nanotube field-effect transistors have been measured and seen to readily possess wide rich regions of classical enhancement and depletion modes, for example exhibiting typical (for example "square-law") voltage-current characteristics associated with common junction gate field-effect transistors (JFETs) and metal-oxide-semiconductor field-effect transistors (MOSFETs). An example of this is described in a publication by Bachtold, A., Hadley, P., Nakanishi, T., and Dekker, C., entitled "Logic Circuits with Carbon Nanotube Transistors," Science, Vol. 294, No. 9, November 2001, pgs. 13 17-1320.

Common JFETs and MOSFETs have been used for many years in discrete and monolithic electronics of both analog and digital varieties. It is recognized that because these overall field-effect transistor (FET) characteristics are similar to widely familiar MOSFETs, well-known MOSFET analog integrated circuit designs may be adapted for use in implementations comprising carbon nanotube FETs (CNFETs) as active elements. However, to date, there seems to have been no recognition of any of the forgoing problems, much less any of the solutions provided herein.

Further, many classical FET-based implementations of analog circuits such as buffer amplifiers, current sources, differential amplifiers, operational amplifiers, comparators, voltage sources, etc. (as well as larger circuit structures built from these), employ direct connects between the sources and drains of pairs of FETs. Accordingly, in accordance with various embodiments, various circuit topologies can be exploited or devised so that a single carbon nanotube may be used to implement several interconnected FETs. Additional techniques may be used in some circumstances to implement several otherwise electrically separate analog circuit elements with a common carbon nanotube.

Carbon nanotube FET analog circuit implementations can additionally benefit from two further powerful properties of carbon nanotubes involving electron carrier and heat transport. As to the first of these, it is known that many types of carbon nanotube field-effect transistors can carry very high currents relative to their size (large integer multiples to that of silicon and in some cases even copper wire). These large current carrying capacities considering relative physical size makes them an excellent match for driving physical-scale interfaces with micro-scale or large-scale systems as depicted in FIGS. 1e and 1f. As to the second of these, carbon nanotubes have excellent heat transmission properties, allowing for the ready implementation of heat sink arrangements.

As such, one feature of the present invention applies "small-signal" and other circuit design techniques to carbon nanotube field-effect transistors ("CNFETs") to create analog electronics for analog signal handling, analog signal processing, and conversions between analog signals and digital signals. As the CNFETs exist and operate at nanoscale, that can be readily collocated or integrated into carbon nanotube sensing and transducing systems, such collocation or integration is at or adequately near nanoscale. These aspects provide for the use of both enhancement and depletion CNFETs.

Further, these techniques may also be applied to other types of carbon-based transistors, such as the gold/thiol molecular transistor pioneered by Schon, Bao, and Meng at Lucent Technologies' Bell Labs. It is noted that this Bell Labs organic transistor is thought to be readily fabricated. See, for example, the publication by Saswato Das, Lucent technologies, entitled "Bell Labs Scientists Usher in New Era of Molecular-Scale Electronics," http://www.eurekalert.org/publeases/2001-10/1tl-bls 101501.php.

It is further understood that graphene nanoribbons and other related materials show electronics properties similar to those of carbon nanotubes, including as a fabric for field effect transistors. In particular graphene nanoribbons may have numerous advantages in at least nanodevice fabrication and size (as small as 10 nm with useful semiconducting properties) now that recent graphene nanoribbon manufacturing methods are emerging, such as that reported in the Jan. 28, 2008 article by Bethany Halford entitled "Graphene Ribbons" in Chemical and Engineering News, Vol. 85, No. 4, p. 15. It is further noted that graphene nanoribbons are emerging as an attractive nanoelectronics medium with both conduction and semiconducting properties.

Various embodiments will be described in the context of carbon nanotubes. However, such teachings apply equally to other related materials, such as graphene nanoribbons, in the implementation of transistors and other electronic components presented herein. As will be described herein, carbon nanotubes, graphene nanoribbons and other related materials can be used to create not only sensors but also field effect transistors, junction transistors, and tunneling devices. Accordingly, the discussion to follow will be largely stated in terms of carbon nanotubes, but one skilled in the art will appreciate that the present disclosure provides for comparable devices and structures to be implemented with graphene nanoribbons and other related materials.

FIG. 1a depicts a carbon nanotube N-channel field effect transistor 100 comprising a carbon nanotube 101 draped between two electrodes 111, 112 over an underlying insulated gate area 113. Current through the carbon nanotube 101 via its two electrodes 111, 112 is determined by the electric field between the underlying insulated gate area 113 and the local volume 103 of the nanotube 101. The device shown in this figure is symmetric and either electrode 111, 112 may serve as source or drain. In some embodiments, other geometries may be used so one electrode may be a more preferable choice for source or drain functions.

Figure 1B:
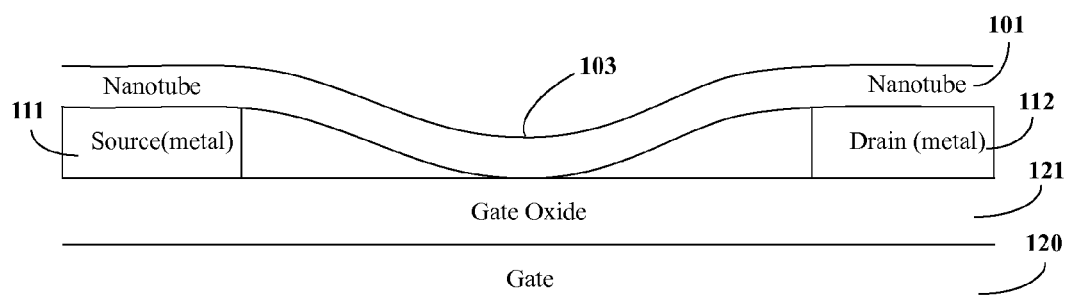
Figure 1C:
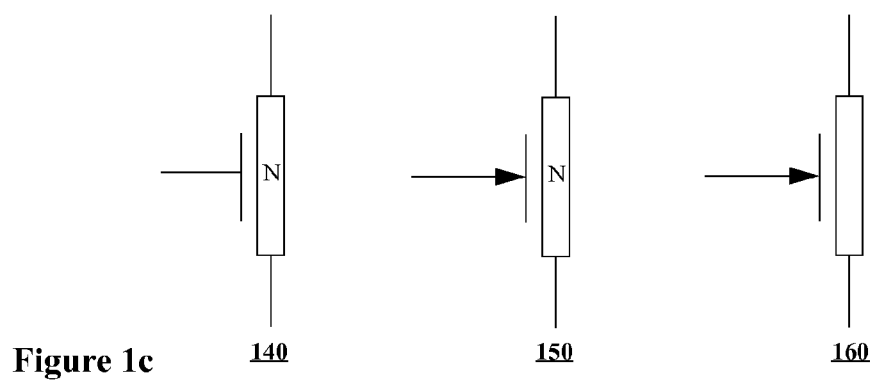
FIG. 1c depicts exemplary symbols that may be used for the component of FIGS. 1a and 1b.

FIG. 1b illustrates a cross-sectional view of the arrangement of FIG. 1a. Here the gate area is realized by an underlying conductive layer 120 which may be made smaller and is not required to underlie electrodes 111, 112. One electrode 111 is arbitrarily deemed as source and the other electrode 112 serves as drain. Other geometric realizations are also possible and may be implemented as required or desired. FIG. 1c depicts symbols 140, 150, 160 that may be used to depict a carbon nanotube N-channel field effect transistor.

The carbon nanotube N-channel field effect transistor 100 is N-Channel due to the presence of absorbed oxygen from the atmosphere during fabrication. It is known that removing the oxygen and sealing to prevent its return results in a P-channel FET.

Figure 2A:
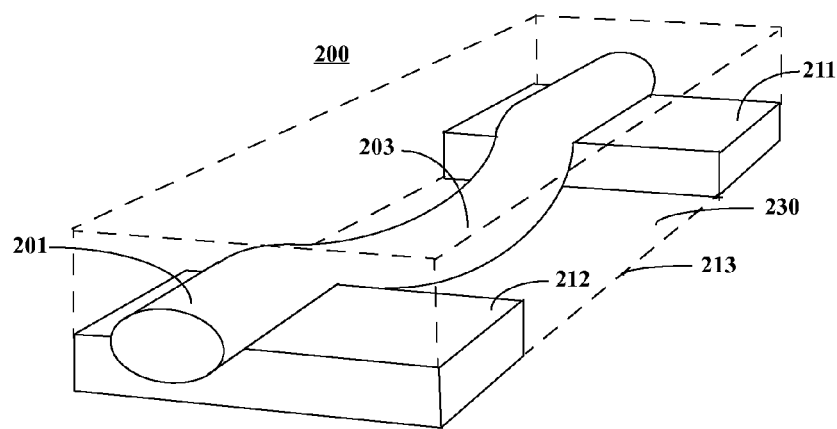
FIGS. 2a and 2b depict exemplary fabrication of a P-type carbon nanotube field effect transistor ("CFFET").

FIG. 2a depicts a carbon nanotube P-channel field effect transistor 200 comprising a carbon nanotube 201 draped between two electrodes 211, 212 over an underlying insulated gate area 213 and sealed with an oxygen-impermeable layer 205. Current through the carbon nanotube 201 via its two electrodes 211, 212 is determined by the electric field between the underlying insulated gate area 213 and the local volume 203 of the nanotube 201.

Figure 2B:
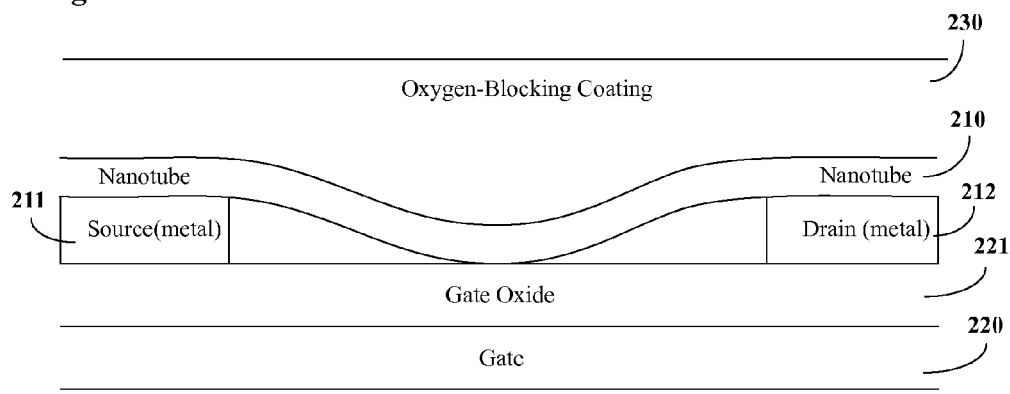
Figure 2C:
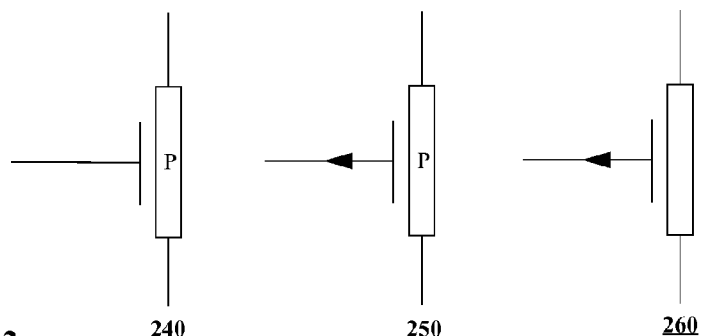
FIG. 2c depicts exemplary symbols that may be used for the component of FIGS. 2a and 2b.

FIG. 2b illustrates a cross-sectional view of the arrangement of FIG. 2a. Here the gate area is realized by an underlying conductive layer 220, insulated from the nanotube 210 itself. It is noted that the underlying conductive layer 220 may be made smaller than depicted, and is not required to underlie electrodes 211, 212. Other geometric realizations are also possible as is clear to one skilled in the art and may be implemented as required or desired. An example of this is described in "Nanotube Electronics," Jan. 28, 2007, pg. 1-5, available at www.mtmi.vu.lt/pfk/funkc_dariniai/nanostructures/nanotubes.htm. FIG. 2c depicts symbols 240, 250, 260 that may be used to depict a carbon nanotube P-channel field effect transistor.

Figure 3A:
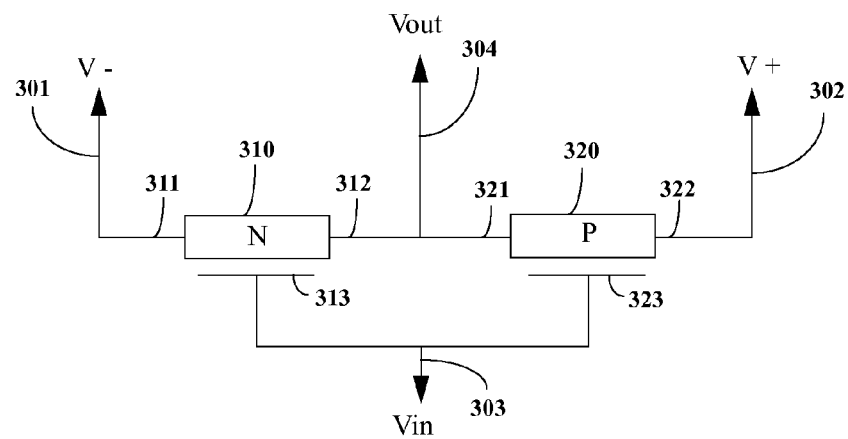
FIGS. 3a through 3c depict an exemplary circuit and realizations of a digital logic gate using two complementary CNFETs.

These two exemplary types of carbon nanotube field effect transistors ("CNFETs") have been shown to be useful in implementing a complementary field effect transistor logic inverter gate. An exemplary circuit diagram for this is shown in FIG. 3a. An example of this is described in the just-identified article of Nanotube Electronics.

Figure 3B:
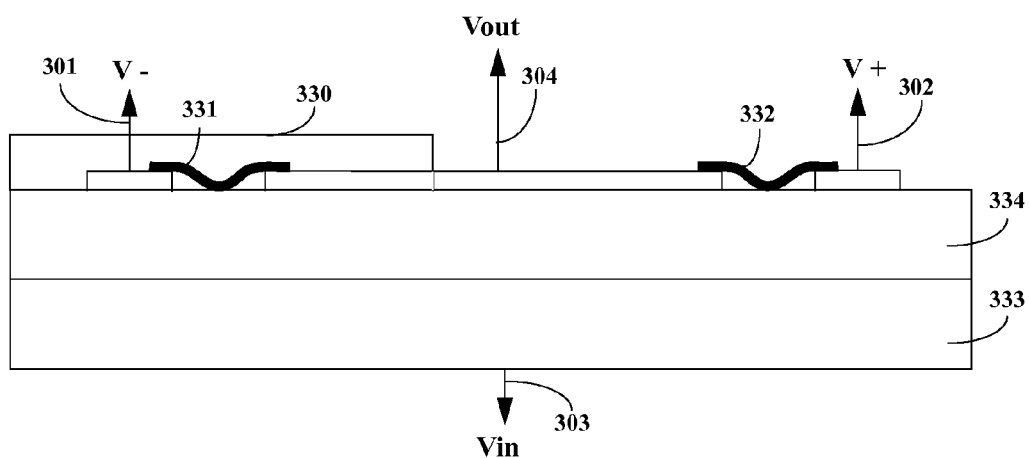
Figure 3C:
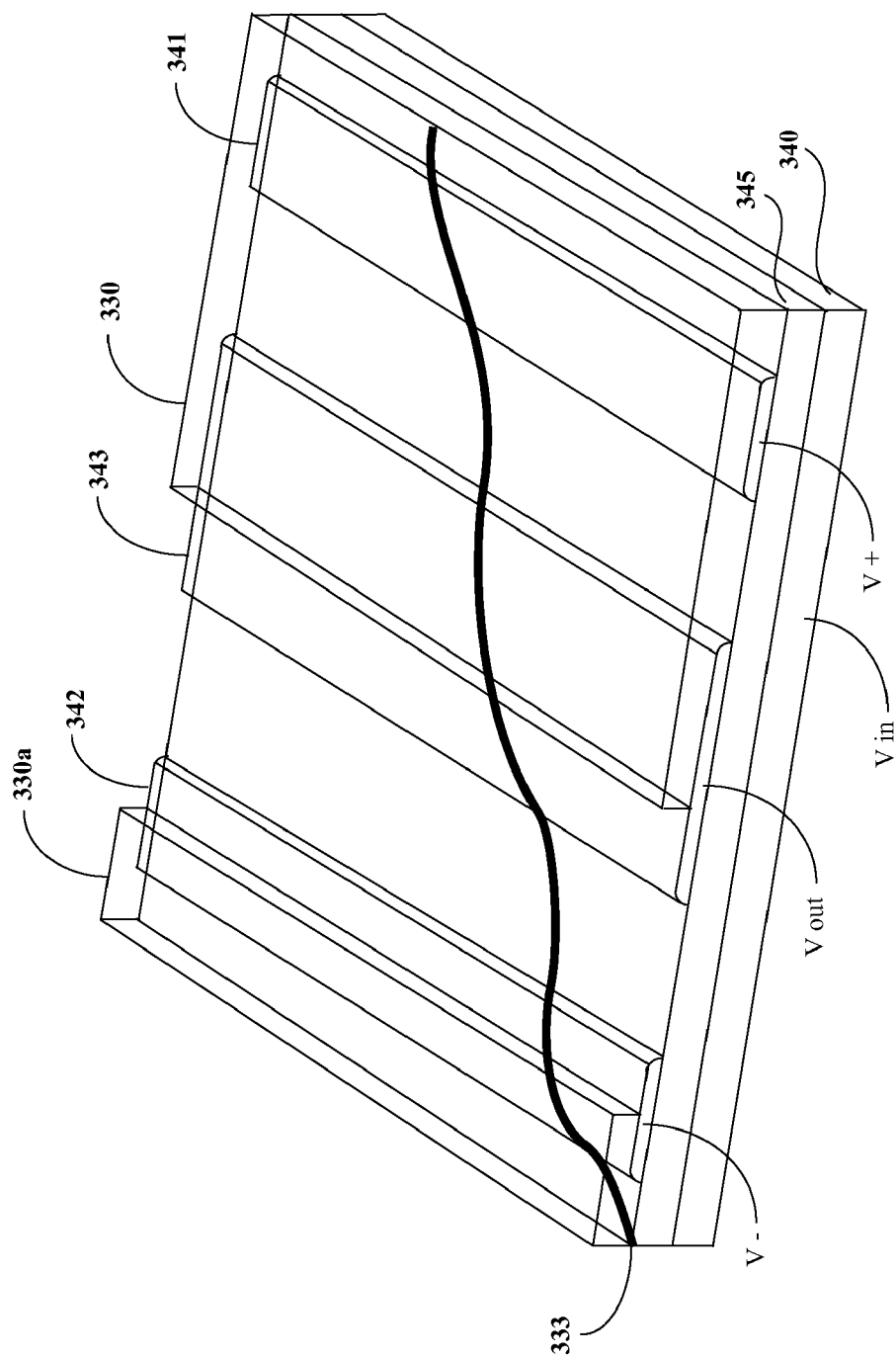

FIG. 3b shows a cross-sectional view of a fabricated embodiment of this circuit utilizing two complementary carbon nanotube field effect transistors on a common substrate. The P-channel FET typically requires an extra oxygen-impermeable layer. FIG. 3c shows one technique for fabricating the circuit from a single nanotube by appropriate controlled positioning over electrodes and controlled deposition of oxygen-impermeable layer. If desired, other known fabrication techniques, structures, and properties may be used including, for example, those which are described in a publication by Gojman, B., Hsin, H., Liang, J., Nezhdanova, N., and Saini, Jasmin, entitled "Y-Junction Carbon Nanotube Implementation of Intramolecular Electronic NAND Gate," Aug. 13, 2004, pgs. 1-24. Other types of CNFETs have been devised, proposed, studied and/or modeled. In some embodiments, the invention provides for the use of these other types of CNFETs rather than the ones described above in conjunction with FIGS. Ia-Ib, 2a-2b, and 3b-3c. These other types of CNFETs include, among others:

single electron CNFET;
kinked-nanotube transistor;
carbon "Y" nanotube;
junction carbon nanotube transistor;
tunneling carbon nanotube transistor.

Examples of the forgoing elements are described in a publication by Richardson, W. H., entitled "Analysis of Carbon Nanotube Intramolecular p-n Tunnel Junction Transistors," Qusemde, 101 Industrial Road Unit 14, Belmont Calif. 94002, and a publication by Sachdev, C., published by Technology Research News and entitled "Nanotube Kinks Control Current," which is available at http://www.trnmag.com/Stories/2001/091201/Nanotube_kinks_control_current09 1201.html, pg. 1-2.

Other related embodiments, following the spirit of the teachings herein, may be made utilizing one or more molecular transistors that do not comprise a carbon nanotube. For example, embodiments of the invention provide for transistors and other electronic components to be realized by graphene nanoribbons rather than carbon nanotubes. As such, substitution of the carbon nanotubes devices and structures with comparable graphene nanoribbon devices and structures is anticipated and provided for by the invention. Additionally, analog circuits utilizing the physical geometry and topology of the carbon "Y" nanotube (rather than special electrical properties) are also anticipated and provided for by the invention with exemplary embodiments to be described in more detail below.

Attention is now directed to an implementation of nanoscale analog electronic circuits, and in particular to realizations comprising carbon nanotubes. One interest relates to a relatively basic circuit, such as a differential amplifier, that can be used in the interfacing of a sensor or sensing-mode transducer. A differential amplifier circuit, for example, can be used to provide amplification and isolation for delicate signals produced by carbon nanotube sensors and other nanoscale sensors. Additionally, in many cases, the differential input arrangement of the differential amplifier provides a basic structural and operational block that is useful for creating feedback structures, particularly negative feedback, as well as in implementing comparators that can provide thresholding and analog-to-digital conversions operations. Further, in one embodiment, a differential amplifier may be used as a comparator for use in converting analog-valued electrical signals to binary-valued electrical signals, other signals, event symbols, and the like.

Alternative embodiments provide for a plurality of comparators to convert analog-valued electrical signals to digitally-valued electrical signals, other signals, and event symbols, among others. If desired, a plurality of these comparators with adequately well-defined output voltage or current values may be used to convert digitally-valued electrical signals, other signals, event symbols, and the like, to analog-valued electrical signals. In some cases, digitally-valued electrical signals are provided, whatever there origin to be operated on by logic circuitry comprising carbon nanotube transistors.

Further, differential amplifiers can be ganged in cascades or further amplified in other ways to produce operational amplifiers. As is well known in the art, operational amplifiers can be used to implement a wide variety of sophisticated functions that are useful for interfacing with sensors and other circuits. Many of these useful sophisticated functions can be implemented in some form directly from a simple differential amplifier. These useful sophisticated functions realizable by simple differential amplifiers and/or from operational amplifiers comprised of differential amplifiers include, among others:

analog unity-gain voltage-follower buffer;
analog voltage gain amplifier;
analog current gain amplifier;

analog signal time-integrator;
analog signal summer;
analog signal inverter;
analog signal filter;
analog signal nonlinear amplifier;
analog voltage-to-current converter;
analog current-to-voltage converter;
analog signal logarithmic amplifier;
analog signal exponential amplifier;
analog signal impedance gyrator;
analog signal negative impedance converter;
analog signal peak detector;
analog signal precision rectifier;
analog signal clamp;
analog signal controller current source;
analog signal transconductance amplifier;
Schmitt trigger.

These and other related circuit realizations are well-know to one skilled in the art of analog circuit design and are documented in many books. Examples of such devices are described in a publication by Jung W., entitled "IC Op-Amp Cookbook," published by Howard W. Sams & Co., Inc., Indianapolis, 1974 and the publication entitled "RCA Linear Integrated Circuits," RCA Corporation, Somerville, 1970.

Additionally, in some situations one or both of the signal input transistors of a differential amplifier may be replaced with a sensor, thus integrating the sensor directly into the sensor interface circuit. In many situations this can save the number of electrical components required, reduce circuit and fabrication complexity, improve sensitivity, improve noise rejection, etc. Thus, a carbon nanotube implementation of an analog differential amplifier is of considerable interest and value for use in conjunction with carbon nanotube sensors and other types of nanoscale systems.

Further, in one embodiment, a differential amplifier is used as part of a controllable analog signal transconductance amplifier, which in turn can be used to create a 2-quadrant or 4-quadrant analog multiplier. See, for example, the publication entitled "RCA Linear Integrated Circuits," RCA Corporation, Somerville, 1970.

The voltage-current characteristics of typical carbon nanotube field effect transistors described earlier are also known to be similar to those for conventional field effect transistors. In particular, it is the characteristics that comprise electrical operating regions outside device saturation which, as an aspect of the invention, may be adapted for conventional small signal linear amplification and other analog circuit applications. In particular, one embodiment of the invention provides for such non-saturating operating regions of various carbon nanotube field-effect transistors ("CNFETs") to be adapted to create differential amplifiers and other analog circuits.

With this established, attention is next directed to linear differential amplifier circuits realized with field-effect transistors that may be adapted for implementation with complementary carbon nanotube field-effect transistors.

Figure 4A:
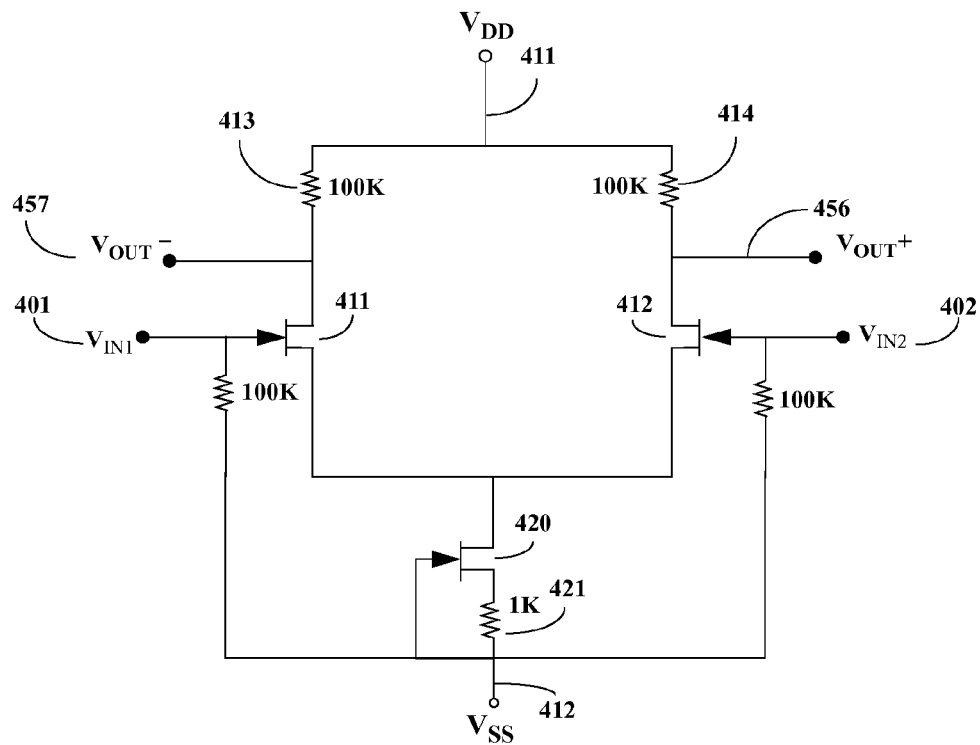
FIG. 4a depicts an exemplary differential amplifier circuit employing JFETs.

FIG. 4a shows a common exemplary type of differential amplifier circuit employing discrete field effect transistors (FETs). Other closely related FET circuit configurations are also well-known. Here the discrete field effect transistors are taken to be junction discrete field effect transistors (JFETs), although MOSFETs or other types of FETs can be used. These types of circuits can be adapted for use, usually directly as depicted in this figure, for a set of enhancement-mode FETs, a set of depletion-mode FETs, or an appropriately selected combination of both types (for example, a depletion mode FET for the current source with the other two FETs being enhancement-mode). The two upper FETs 411, 412 in the circuit of FIG. 4a are typically a closely-matched pair. The lower FET 420 provides a constant current source. Experimentation shows an adequate constant current source behavior may be realized by the FET and resistor configuration depicted from either enhancement or depletion-mode FETs, as long as care is taken to bias the FET in a non-saturating region of operation.

Other variations are possible for the current source; for example, using diodes with a forward voltage drop rather than using one or more resistors. A number of simply realized carbon nanotube diodes have been reported, including the one by General Electric Global Research with current-voltage characteristics nearly exactly following the ideal diode equation reported in http://nanotechweb.org/cws/article/tech/19870 and Applied Physics Letters 87,073101, Aug. 8, 2005. Depending on the characteristics of the diode relative to the current source FET 420, the topological circuit arrangement depicted in FIG. 4a may be modified as is clear to one skilled in the art of designing simple FET-based analog constant current sources.

In FIG. 4a, two complementary outputs 456, 457 are provided; if both are used these are arbitrarily labeled $V_{OUT+}$ and $V_{OUT-}$. However, quite often only one of these two possible voltage outputs is employed. Power is shown being provided across the $V_{DD}$ terminal 411 and $V_{SS}$ terminal 412. For example, for a discrete JFET such as N-channel depletion-mode MPF 102 used as all three transistors 411, 412, 420, power supply $V_{DD}$ may be set at +12 volts and power supply $V_{SS}$ may be set to −12 volts. Should a P-type FET be used for all three transistors 411, 412, 420, power supply $V_{DD}$ will be set to a negative power supply voltage while $V_{SS}$ will be set to a positive power supply voltage.

Figure 4B:
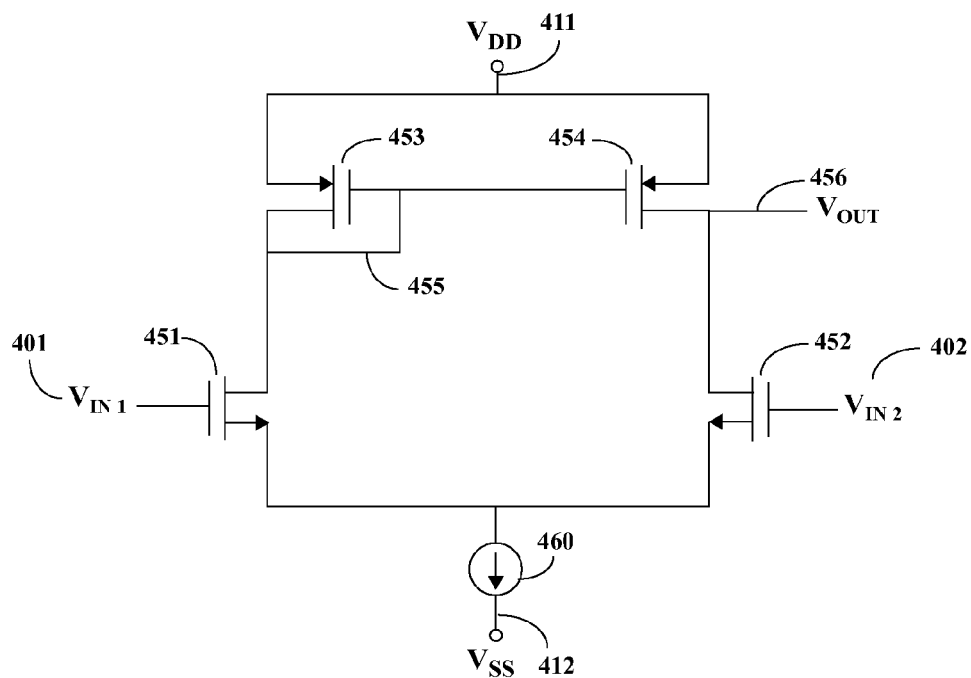
FIG. 4b depicts an exemplary differential amplifier circuit employing MOSFETs and complementary active load MOSFETs.

FIG. 4b depicts a similar exemplary FET differential amplifier circuit, here realized with MOSFETs rather than JFETs, and further adapted with complementarytyped (i.e., P-channel if others are N-channel and vice-versa) FETs 453, 454 are used to create replacements for the load resistors used in the circuit of FIG. 4a. Transistors used in this configuration are commonly called "active loads" and are commonly for traditional FET operational amplifiers ("op amps") and other types of integrated circuit components made from silicon. Such active load circuits are very familiar to one skilled in the art of monolithic operation amplifiers.

In view of the many types of current source circuits that could be used, FIG. 4b depicts the current source 460 feeding the input MOSFETs 451, 452 as an abstract current source symbol; as is appreciated by one skilled in the art the current source may be implemented in a wide range of ways, and can include incorporation of a current mirror as will be discussed in a later circuit. Further, if the current source is implemented in such a way that it is controllable responsive to an additional input signal, particularly if the response is linear over a sufficiently wide range, a multiplication element can be realized. An example of such signal multiplication circuits will be discussed later.

In general, an external input signal and/or feedback signal can be presented to either of the two signal inputs 401, 402 in FIG. 4a and FIG. 4b. Power is shown being provided across the $V_{DD}$ terminal 411 and $V_{SS}$ terminal 412. If the lower three transistors are realized with N-channel field effect transistors, forcing the upper two (complementary active load) transistors to then comprise P-channel field effect transistors, $V_{DD}$ will serve as the positive voltage power terminal and $V_{SS}$ will serve as the negative voltage power terminal. If the types of transistors are reversed, $V_{DD}$ will serve as the negative voltage power terminal and $V_{SS}$ will serve as the positive voltage power terminal. As is well known to one skilled in the art of analog circuits, signal output may be obtained at either or both of the junctures between each upper (complementary active load) transistor and its immediately connected neighbor signal input transistor.

As is well known to one skilled in the art of analog circuits, these two signal outputs differ in sign as to the small-signal variation produced responsive to the signal inputs. For either output, an increase in voltage at one of the two signal inputs will cause an output signal voltage increase while an increase in voltage at the other signal inputs will cause an output signal voltage decrease as is well known to one skilled in the art of analog circuits. As will be demonstrated and as provided for by various embodiments of the invention, the exemplary type of circuit arrangement depicted in FIG. 4b may be realized by carbon nanotube field effect transistors ("CNFETs") for a number of different reasons including, for example, the following:

- The use of mostly field effect transistors, in particular no use of load resistors;
- The only resistor in the circuit can be on the order of 1 K-ohms (and can be replaced if diode-based voltage references are used to position the operating point of a current source transistor);
- The interconnections among the transistors mostly involve connections between sources and drains;
- There are no topological loops in the circuit graph.

Among other benefits made available by such embodiments, circuit designs with these properties can be adapted so that a plurality of the components may be realized with the same carbon nanotube. This considerably simplifies fabrication, and further naturally allows for matching pairs or other pluralities of components, such as input FETs 451, 452 and active load FETs 453, 454 of the exemplary arrangement depicted in FIG. 4b. Alternatively, the same or similar technique may be applied to other nano-scale materials with related semiconducting properties, such as graphene nanoribbons.

Figure 5A:
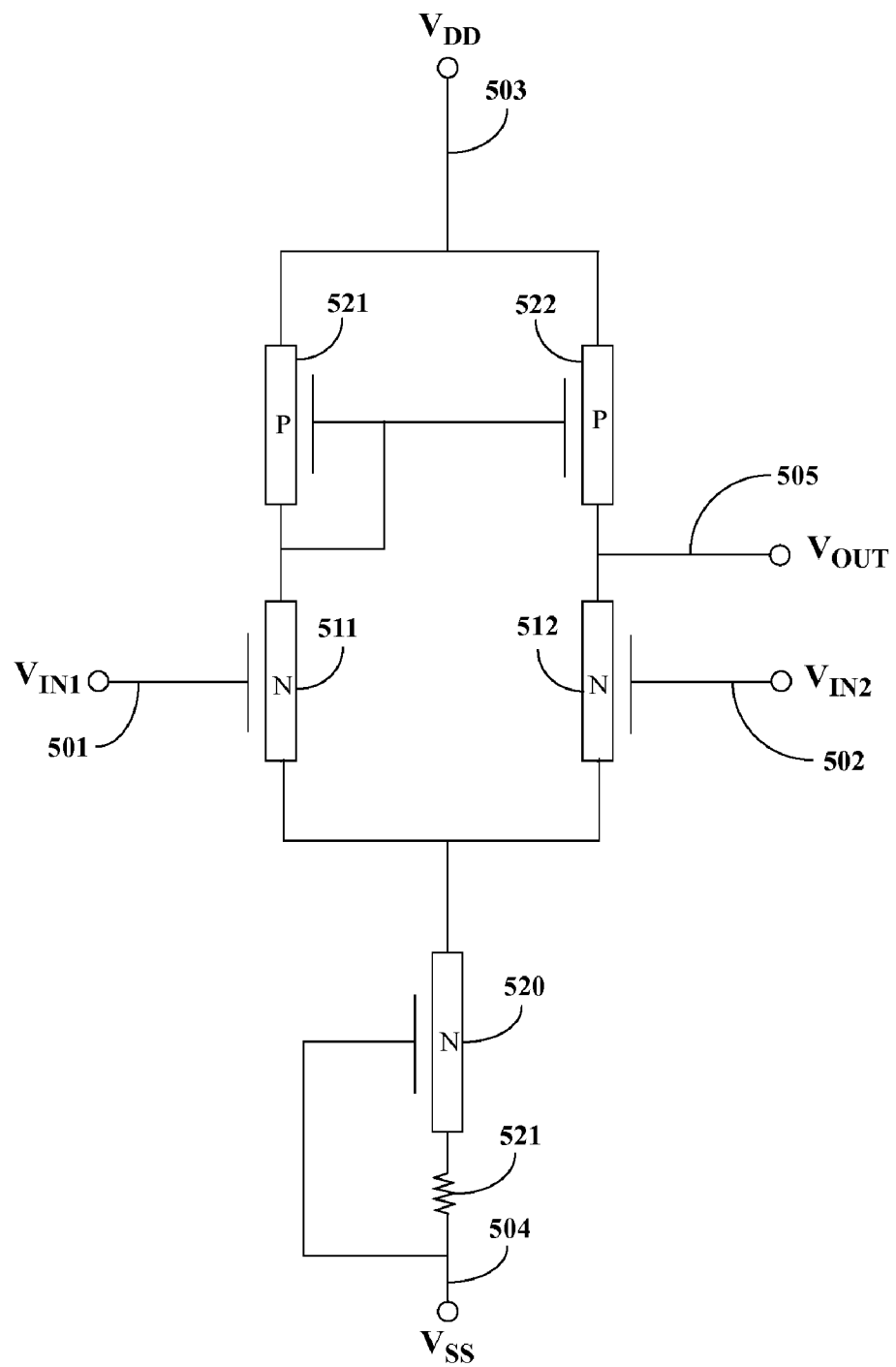
FIGS. 5a and 5b depict an alternative implementation of FIG. 4b utilizing CNFETs.
Figure 5B:
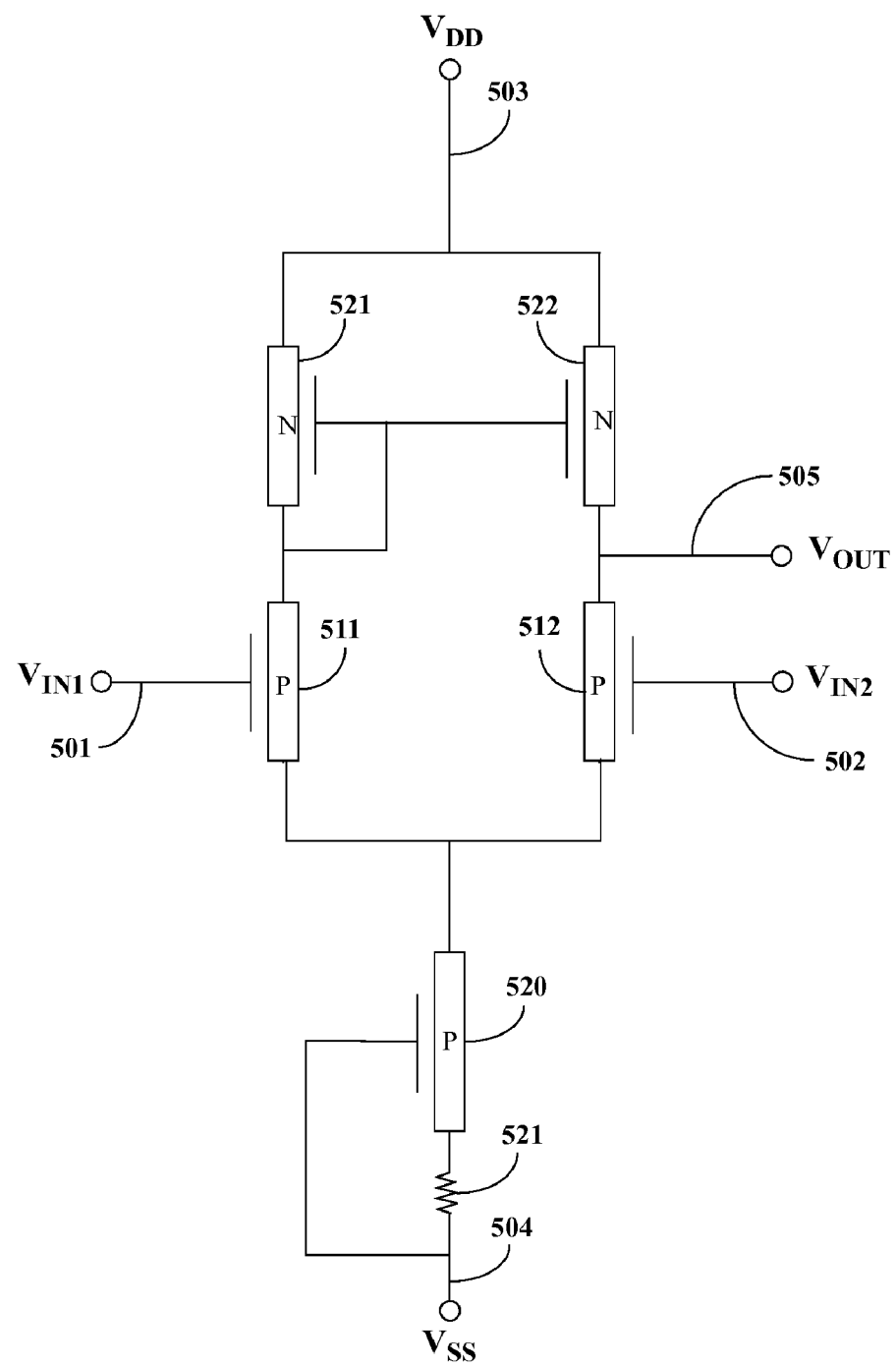

FIGS. 5a and 5b depict an alternative to FIG. 4b such that CNFETs 511, 512, 520, 521, 522 of appropriate complementary types (N-type and P-type) are shown replacing the exemplary MOSFETs 451-454 in implementing in the constant circuit source 460 of FIG. 4b. In particular, FIG. 5a depicts a case wherein the active load CNFETs are P-type and other CNFETs are N-type (in this example power supply $V_{DD}$ will be set to a positive power supply voltage while $V_{SS}$ will be set to a negative power supply voltage). In contrast, FIG. 5b depicts a case wherein the active load CNFETs are N-type and other CNFETs are P-type (in this example power supply $V_{DD}$ will be set to a negative power supply voltage while $V_{SS}$ will be set to a positive power supply voltage). In these cases, carbon nanotube field effect transistors ("CNFETs") as current source, differential pair, and active loads.

Figure 5C:
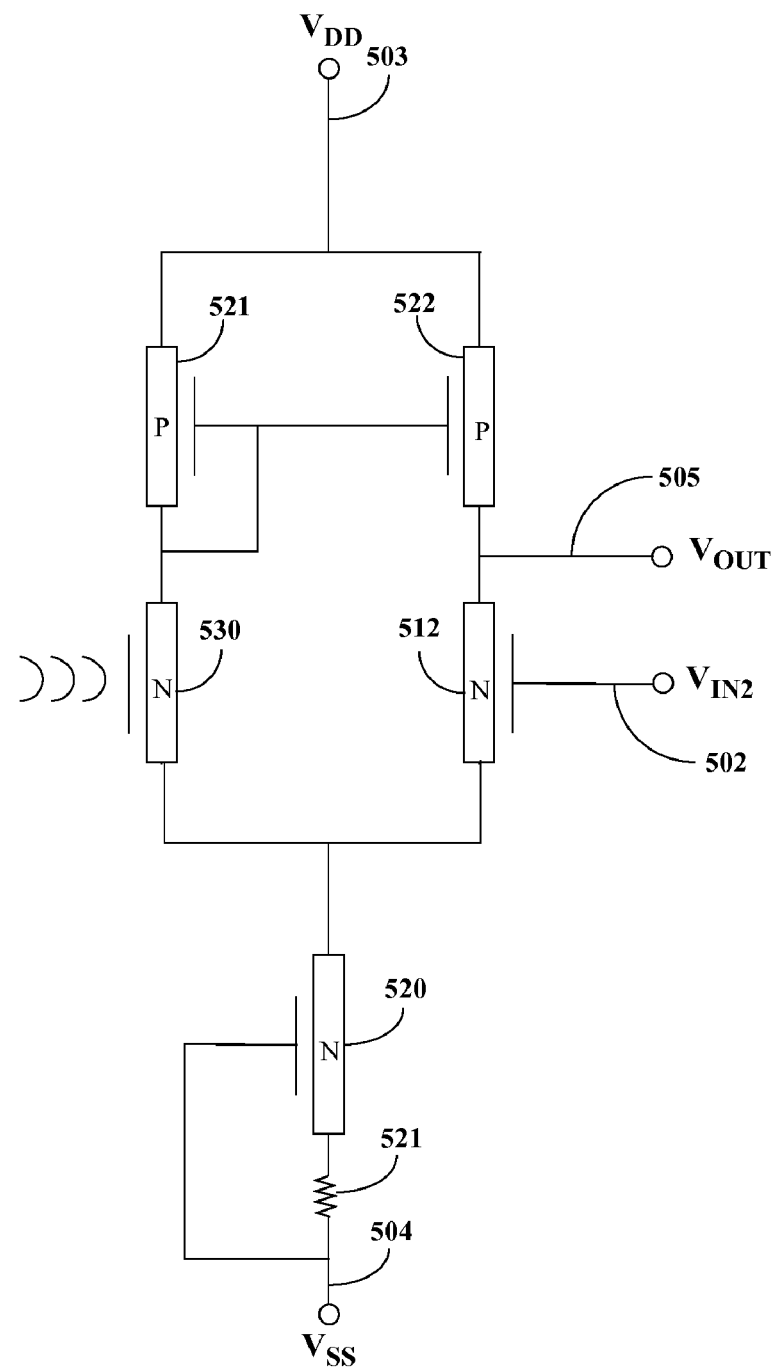
FIG. 5c shows a variation of the arrangement of FIG. 5a wherein one of the differential-input field effect transistors is replaced by a sensor, such as a carbon nanotube sensor that behaves electrically as an input-signal controlled FET.

As discussed earlier, under certain conditions it is possible to replace one or both of the input transistors of a differential amplifier with a sensor element. FIG. 5c shows the arrangement of FIG. 5a wherein one of the differential-input field effect transistors is replaced by an appropriate sensor 530. The resulting circuit behaves as a differential pair responsive to the phenomenon electrically observed by the carbon nanotube sensor. Alternatively, the other signal input transistor 512 could be replaced with a sensor instead. In yet another alternative, both of the signal input transistors 511, 512 in FIG. 5a could be replaced with an appropriate sensor.

Further as to the utility of various embodiments of the present invention, several carbon nanotube sensors have been described as using a carbon nanotube field effect transistor or a similarly or closely related structure. In one example, a large organic affinity molecule may be attached to a carbon nanotube in a region between two electrodes. A chemical reaction event involving the large organic molecule affects the current flow through the carbon nanotube. This process of varying the current through the carbon nanotube as a function of the electric field in a region between two electrically terminating electrodes is very similar to the actions within a carbon nanotube field effect transistor, effectively using the large organic affinity molecule as a substitute gate terminal of a FET.

In this view as a modified field effect transistor, chemical affinities or reactivity of the attached organic molecule causes changes in the electric field in the vicinity of the attachment point and thus generally affects the current flow through the carbon nanotube. Such sensors have been reported by, among others, Collins, Goldsmith, Coroneus, et al. in Science 2007, pgs. 315 and 77. It is noted that similar types of semiconductor field effect chemical sensors employing silicon-based semiconductor structures are often referred to as "bioFETs."

The configuration of FIG. 5c and assorted variations will be called upon later in the discussion to follow. One advantage of these embodiments of the present invention relates to using fabricated carbon nanotubes for both the sensor and nano-electronic components of a nano-scale system. However, as will be discussed, even further utility and advantage may be accomplished by using the same carbon nanotube for both a sensor and one or more transistors of an associated carbon nanotube differential amplifier or other carbon nanotube electronic circuit.

Figure 6A:
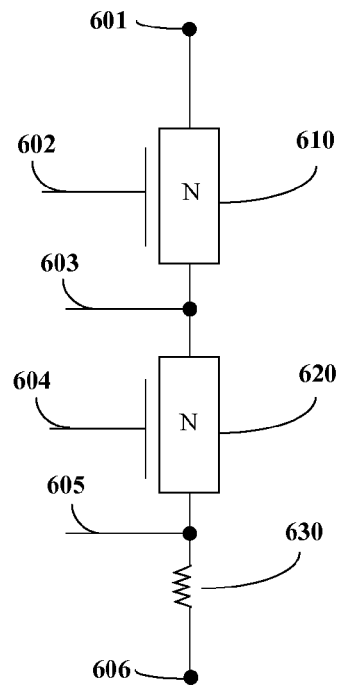
FIGS. 6a and 6b show a circuit and corresponding single carbon nanotube implementation of an exemplary current source that may be used for implementations of a field-effect current source.
Figure 6B:
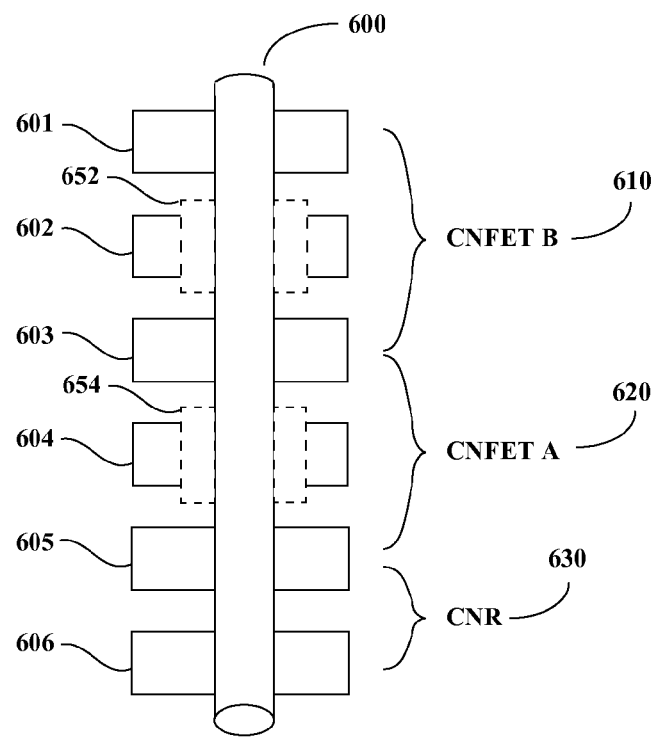

In FIG. 3b, two CNFETs of the same circuit are shown sharing a drain terminal. In FIG. 3c, depicting results reported by Gojman, B., Hsin, H., Liang, J., Nezhdanova, N., and Saini, Jasmin, in a publication entitled "Y-Junction Carbon Nanotube Implementation of Intramolecular Electronic NAND Gate," Aug. 13, 2004, pgs. 1-24, two such FETs are shown in a configuration realized by a single carbon nanotube. FIGS. 6a and 6b demonstrate exemplary generalizations of this example and may be implemented in accordance with various embodiments of the present invention.

FIG. 6a depicts a technique for adapting the field-effect current source of FIGS. 5a through 5c for electronic components using carbon nanotubes. FIG. 3c shows a digital carbon nanotube field effect transistor logic circuit art of a primitive two-CNFET logic gate wherein two CNFETs, in a primitive logic gate circuit, share a drain terminal realized by a single carbon nanotube. This embodiment provides for generalizations which permit far more general circuit topologies involving connected components that can be realized with a common carbon nanotube draped across both shared and interconnected contacts. FIGS. 6a and 6b depict an example of this scenario such that they include the current source for the differential amplifier circuits of FIGS. 5a through 5c as being realized with a common carbon nanotube.

In FIG. 6a, a single carbon nanotube 600 lies across electrodes 601-606. If electrode 604 lies below an insulating layer 654 while adjacent electrodes 603, 605 connect directly to the carbon nanotube, a CNFET results. Similarly, if electrode 602 lies below an insulating layer 652 while adjacent electrodes 601, 603 connect directly to the carbon nanotube, a second CNFET results, and these two CNFETs share a terminal that could in many embodiments be either the source or drain of either FET. In this embodiment, insulated terminals 602, 604 may serve as the gates of these two interconnected CNFETs. The CNFETs may be either simultaneously or independently configured, via oxygen management, to be either N-channel or P-channel field effect transistors. Oxygen exclusion layers needed for a P-channel CNFETs may be realized by covering the carbon nanotube at least in the region spanning the source and drain terminals for a specific FET.

Also shown in FIG. 6b is a sixth electrode 606 under the nanotube. If this electrode 606 is connected directly to the nanotube, the resulting structure between electrodes 605 and 606 can serve as a diode or resistor depending upon additional fabrication and electrical circuit operating points. Current approaches to carbon nanotube implementations of resistors thus far do not offer much range in resistance, typically offering a resistance on the order of 1K ohms. From the electrical bias and gain curves found in the art for the types of carbon nanotubes field effect transistors considered, experimental design and study confirms that an adequate current source for use with differential amplifiers can be realized with resistive element 630 having, for example, a resistive value on the order of 1K ohms using the circuit of FIG. 6a. This arrangement, for example, permits making an analog differential amplifier from carbon nanotubes field effect transistors, thus reducing the required number of carbon nanotubes that are to be involved.

Should other resistances be needed between terminals 605 and 606, or for other analog circuits, multiple carbon nanotube resistors may be interconnected in series, parallel, series-parallel, or yet other network arrangements to obtain multiples, submultiples, and other variations of the currently limited resistance value obtained by known carbon nanotube resistors. Alternative resistor techniques may also emerge which would provide a wider range of resistive values, and these arrangements may alternatively be implemented.

As to the current source depicted in FIGS. 6a and 6b, it is noted that alternatively the circuit element between electrodes 605 and 606 can be replaced with a junction or other form of diode realized by carbon nanotubes by simply employing other types of fabrication techniques. This would be useful in a current source implementation, albeit likely with a different circuit topology from that of FIG. 6a, if a stable voltage drop can be realized by the resulting carbon nanotube diode.

It is additionally noted that in other types of circuit implementations, the sixth electrode 606 may be insulated from the nanotube to form a capacitive or other type of circuit element between electrodes 605 and 606. Such a capacitive element may, for example, be put in parallel with resistive element 630 to alter the higher frequency behavior of the circuit. Use of such carbon nanotube capacitors will be revisited later in the disclosure.

With the current source implementation above devised, one can now combine it with two interconnected complementary pairs of carbon nanotube transistors biased by the supply voltages and current source to operate in analog modalities rather than in saturating modes as is the case in digital CNFET logic circuits. Further, the carbon nanotube transistor whose channel type (P-channel or N-channel) is complementary to the type used in the current source can be wired so that its gate connects to its source terminal to form an active load transistor circuit. The result is a differential amplifier which can be realized with carbon nanotubes as provided for by embodiments of the invention. Various examples with differing features and utility are demonstrated below. These examples are non-limiting as many related and non-related variations are possible as is clear to one skilled in the art as provided herein.

Figure 7A:
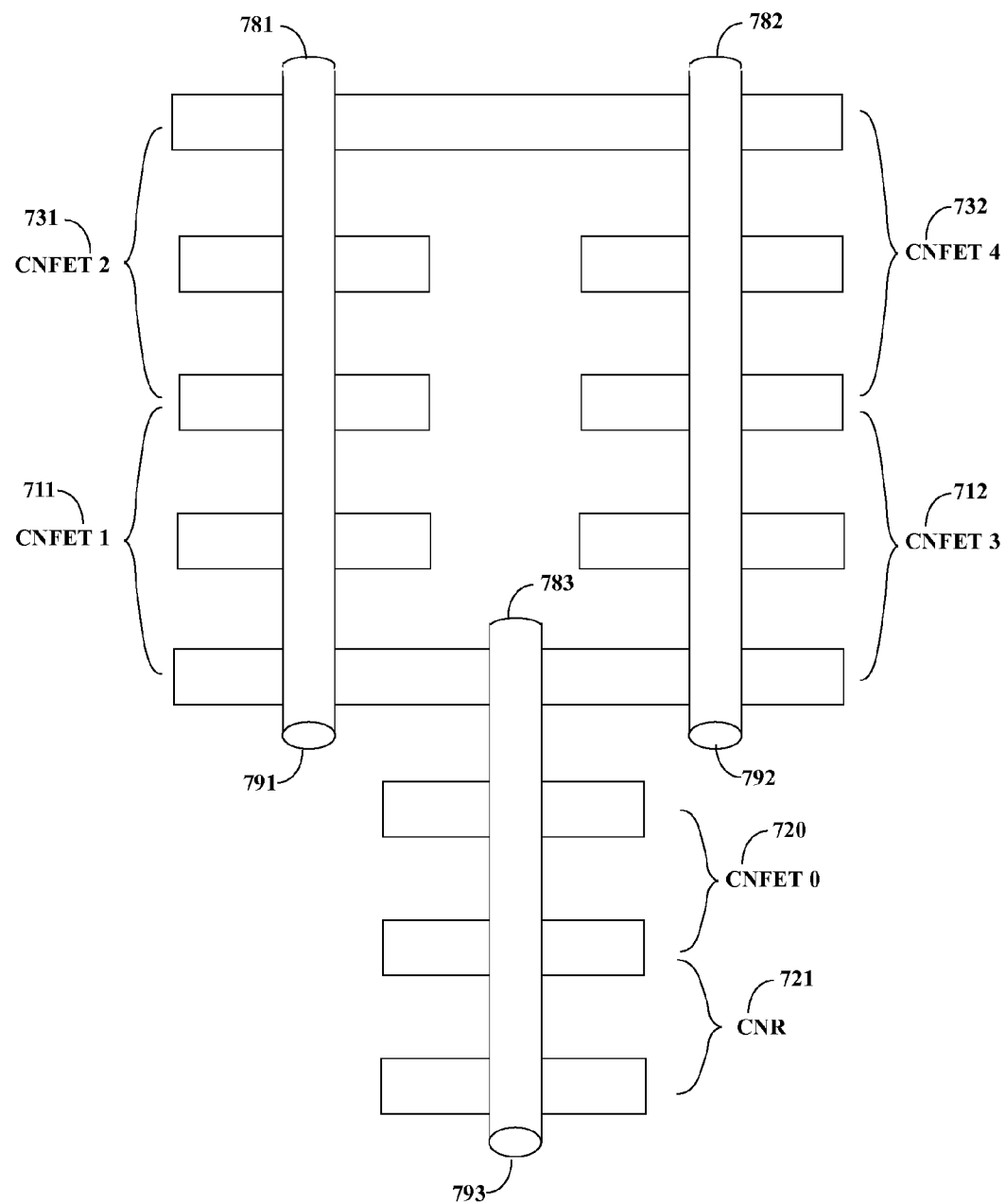

FIG. 7a shows a three carbon nanotube segment implementation of the differential amplifier circuit of FIG. 5a. To obtain a general structure illustration, only the relative positions of a segment of the three carbon nanotubes with respect to conductive electrical contacts and their interconnections are shown. For clarity, the figure omits the oxide or other types of layers used to isolate electrical contacts from the carbon nanotubes to create the gate terminal of a CNFET. Also omitted are the oxide or other types of layers used to create P-channel CNFETs of FIGS. 2a-2b or other types of CNFETs. In this way, the same diagram can be used independent of the choice of the CNFET channel type (N-channel or P-channel) used for the current source and input CNFETs and the complementary CNFET channel type (P-channel or N-channel, respectively) used for the two active load CNFETs at the top of the diagram. The sequence of electrically conductive contacts and oxide or other insulating material layer segments thus define a sequence of interconnected CNFETs matching the circuit topology of FIG. 5a. The bottom portion of this figure shows a carbon nanotube resistor formed by two adjacent electrical contacts with no insulating gate terminal structure between them.

Figure 7B:
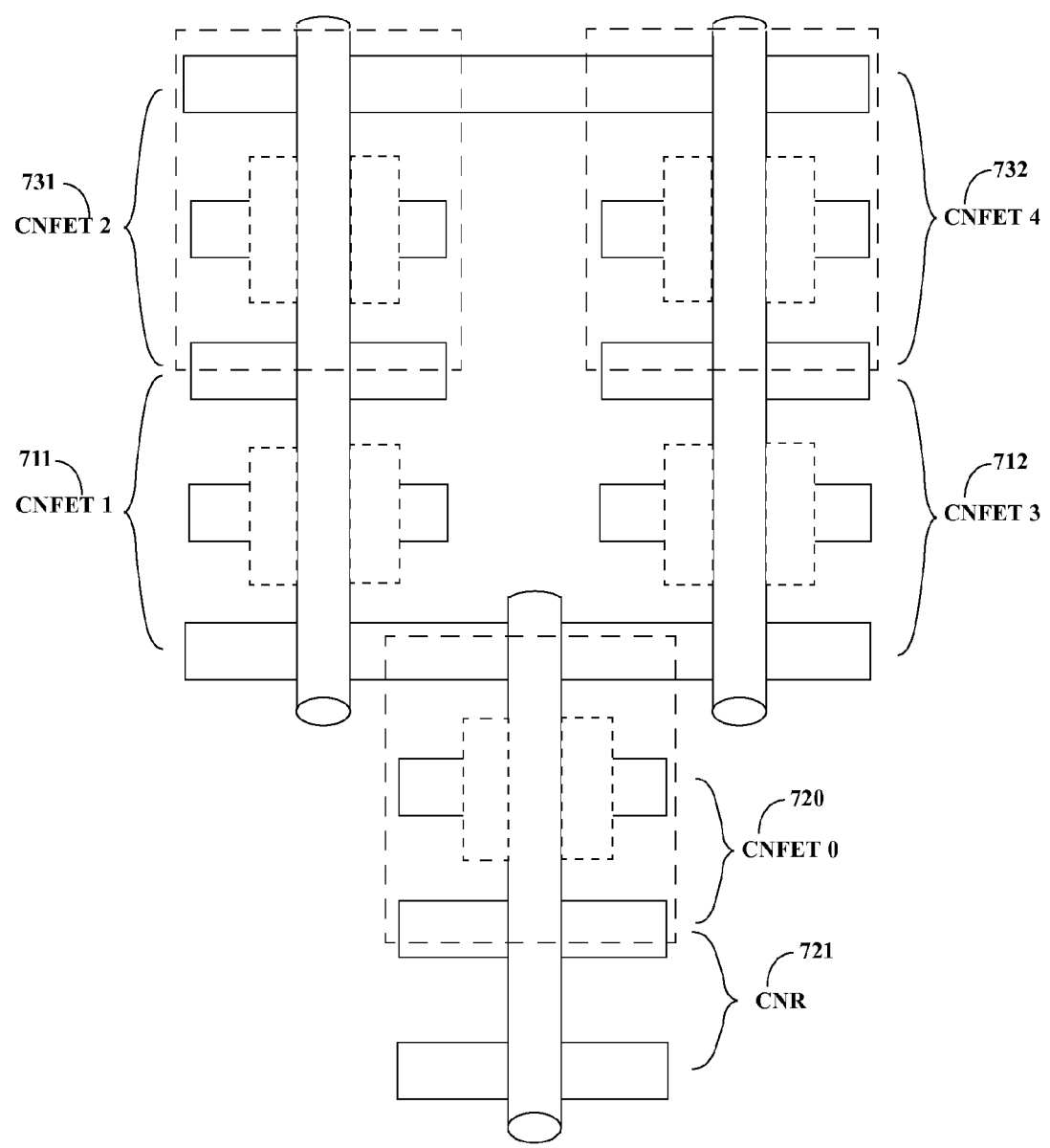

FIG. 7b shows a version of FIG. 7a with the oxide or other types of layers (depicted in the closely-spaced broken line region outlines) used to isolate electrical contacts from the carbon nanotubes to create the gate terminal of a CNFET, as well as the oxide or other types of layers (depicted in the more coarsely-spaced broken line region outlines) used to create P-channel CNFETs of FIGS. 2a-2b or other types of CNFETs.

The conductive electrical contacts depicted in FIGS. 7a and 7b may include metallization or conductive polymer layers, films, depositions, and the like. The interconnections among the conductive electrical contacts may include the same or similar electrically conductive material as the conductive electrical contacts or may be made of a different electrically conductive material. It is noted that non-metallic electrically conductive materials, used for contacts, interconnections, or both, can be selected according to the heat conduction properties they possess. For example, if the electrically conductive material is a poor conductor of heat, more heat can be concentrated in the carbon nanotube for heat sinking designs. It is further noted that nonmetallic electrically conductive materials, used for contacts, interconnections, or both, can be selected according to adherent properties they may possess in attaching and/or electrically contacting with the contacted region of the carbon nanotube. It is additionally noted that non-metallic electrically conductive materials, used for contacts, interconnections, or both, can be selected according to other electrical properties that they may possess.

Figure 7C:
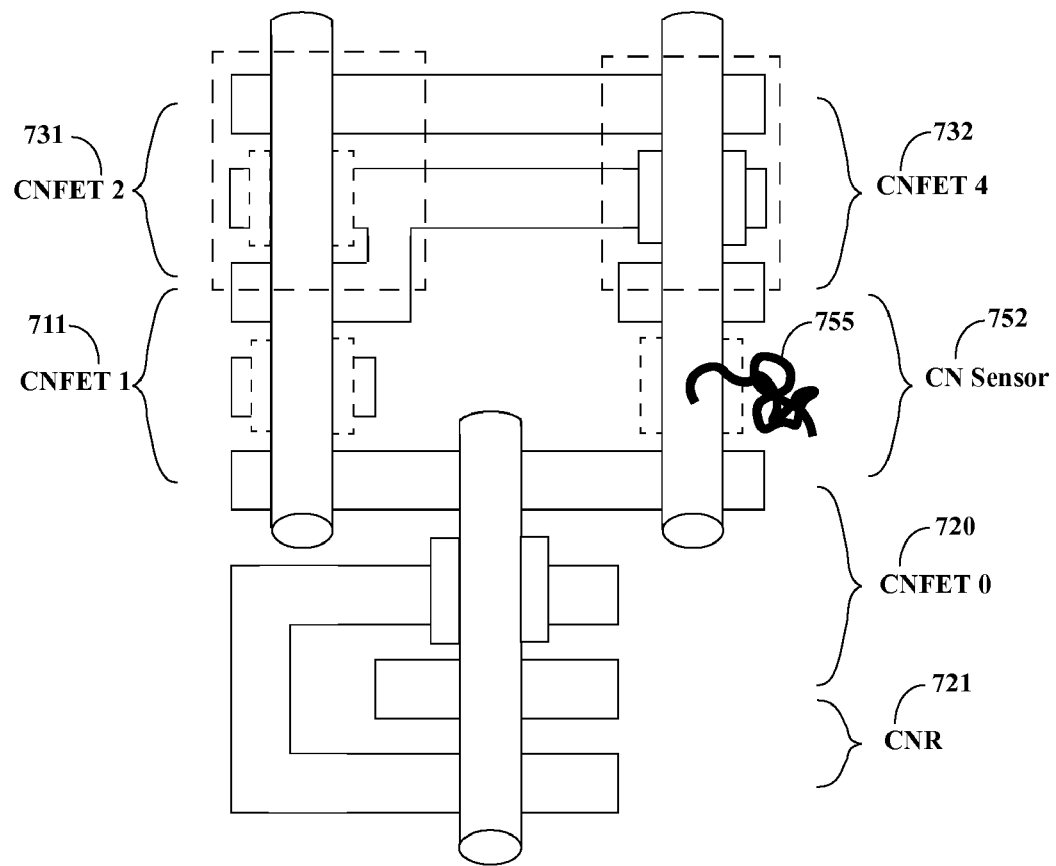
FIG. 7c depicts a variation on the arrangement of FIGS. 7a and 7b wherein one of the input CNFETs has been replaced with a carbon nanotube sensor.

Further, the arrangement depicted in FIGS. 7a and 7b can be modified such that either or both of the signal input transistors CNFET1 or CNFET3 are replaced with a carbon nanotube sensor in the manner depicted in FIG. 5c. As an example, the arrangement depicted in FIGS. 7a and 7b can be modified so that either or both of CNFET1 and/or CNFET3 are replaced with, for example, the affinity-molecule carbon nanotube sensor described earlier. FIG. 7c depicts an exemplary adaptation of the arrangement of FIG. 7b wherein CNFET3 712 has been replaced with an affinity molecule carbon nanotube sensor 752 having an affinity molecule 755. Other types of appropriate sensors could be used in place of the exemplary affinity-molecule carbon nanotube sensor as is clear to one skilled in the art and as provided for by embodiments of the invention.

As another example, either or both of CNFET CNFET1 and/or CNFET3 may be replaced with an appropriate optical sensing carbon nanotube sensor or optical sensing CNFET. Also, either or both of the active load CNFET2 and/or CNFET4 may be replaced with an appropriate optical sensing carbon nanotube sensor or optical sensing FET. Either or both of these optical sensing and optical emitting CNFET arrangements allow for optical signal interconnections among carbon nanotube segments, within regions within the same carbon nanotube, or signal connections with external systems. A number of simply realized optical sensing CNFETs and optical emitting CNFET have been reported, for example as special cases of the diode1CNFET technology by General Electric Global Research as reported in http://nanotechweb.org/cws/article/tech/19870 and Applied Physics Letters 87,073101, Aug. 8, 2005.

Figure 7D:
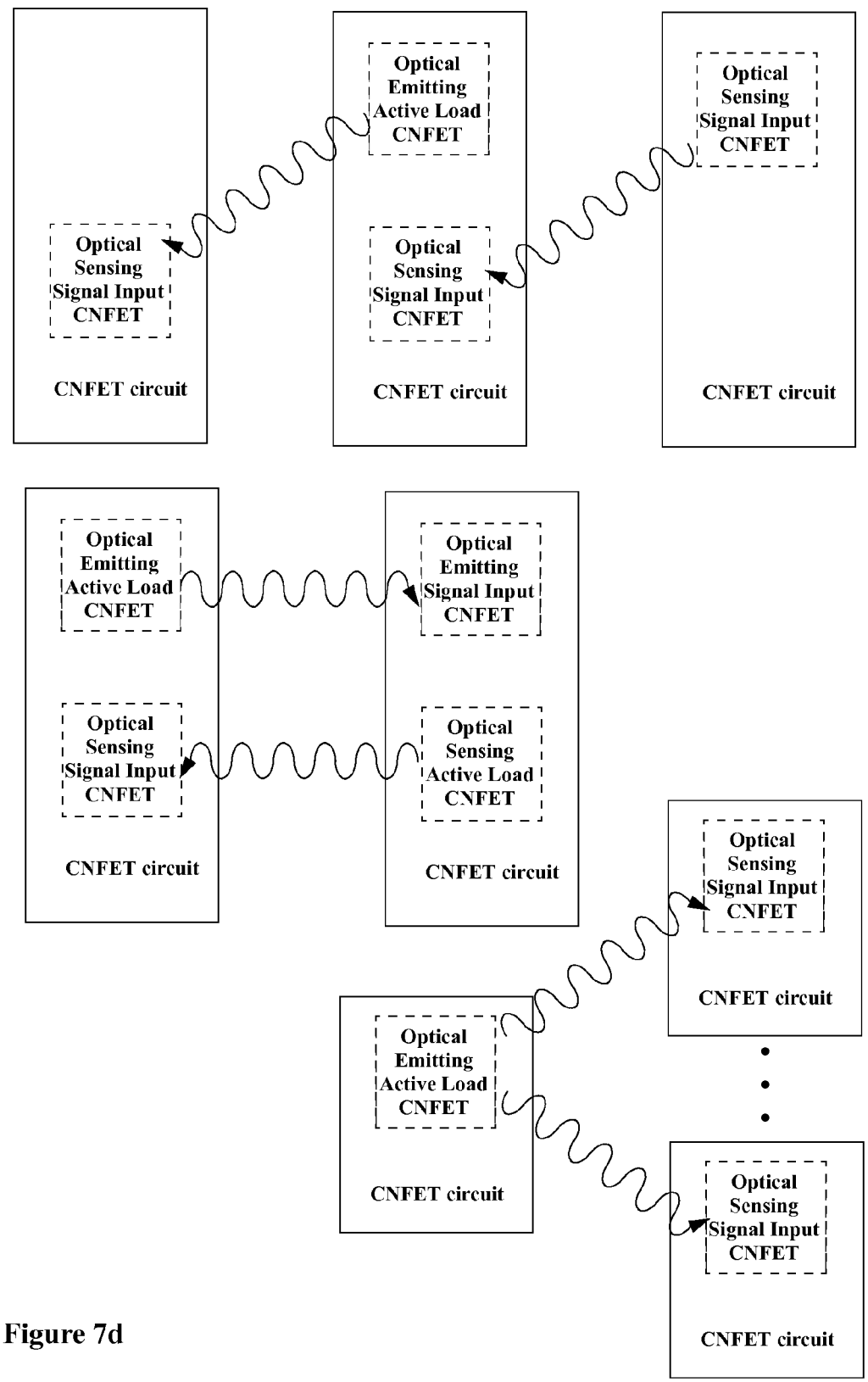
FIG. 7d illustrates various examples using optical signal conductivity to link inputs and outputs of CNFET circuits such as differential amplifiers.

FIG. 7d illustrates an example of how such optical signal conductivity can be used to link inputs and outputs of CNFET circuits, such as the differential amplifiers described above. Shown here are a cascade/daisy-chain, two-way peer-to-peer, and broadcast arrangements. Optical links may be realized by direct proximity or via optical transmission structures. One skilled in the art will appreciate that the teachings herein provide for a wide range of other optical interconnection topologies, such as rings, bidirectional busses, and the like. If desired, additional optical communications methods, such as wavelength-division multiplexing, can be added to the above capabilities.

FIGS. 7a through 7c demonstrate the use of three carbon nanotubes with associated fabrication and alignment complexities. However, the circuit topology of the circuits of FIGS. 5a through 5c further allow the same carbon nanotube to be used for both the current source portion and continue on to be used for one or both of the two interconnected complementary pairs of carbon nanotube transistors. Examples of these cases are also provided.

Figure 8A:
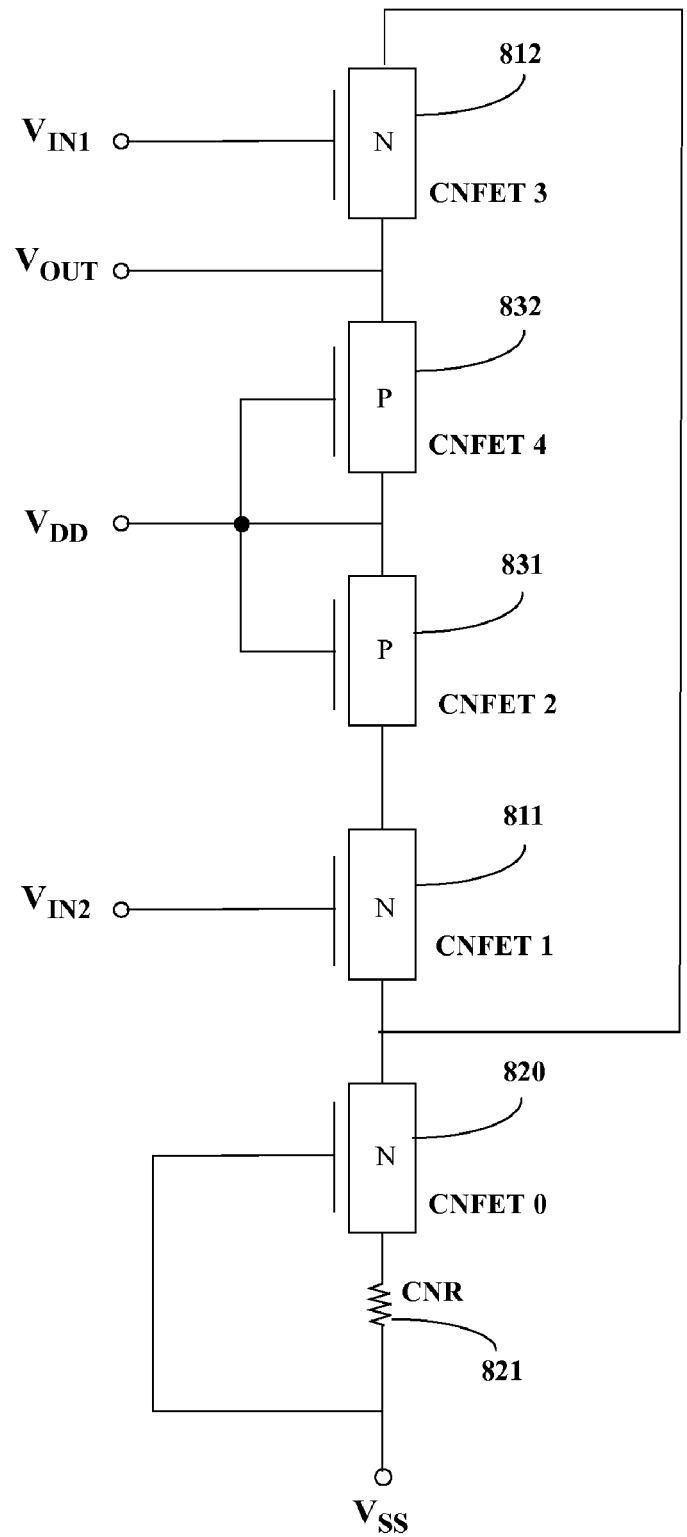
FIG. 8a depicts an alternative differential amplifier circuit of FIG. 5a wherein the layout has been adapted to sequence the location of the devices into a chain of electronic components whose geometrically-extreme terminal locations are directly interconnected.

FIG. 8a depicts an alternative arrangement of the differential amplifier circuit of FIG. 5a. In FIG. 8a, the layout has been changed to sequence the location of devices 811, 812, 820, 821, 831, 832 into a chain of electronic components whose geometrically-extreme terminal locations are directly interconnected. These direct interconnections permit a common carbon nanotube to implement each of these devices by laying it across a sequence of electrodes and insulating layers and, where required, subsequently applying an oxygen management layer to convert regions of the nanotube from N-type material to P-type material.

Figure 8B:
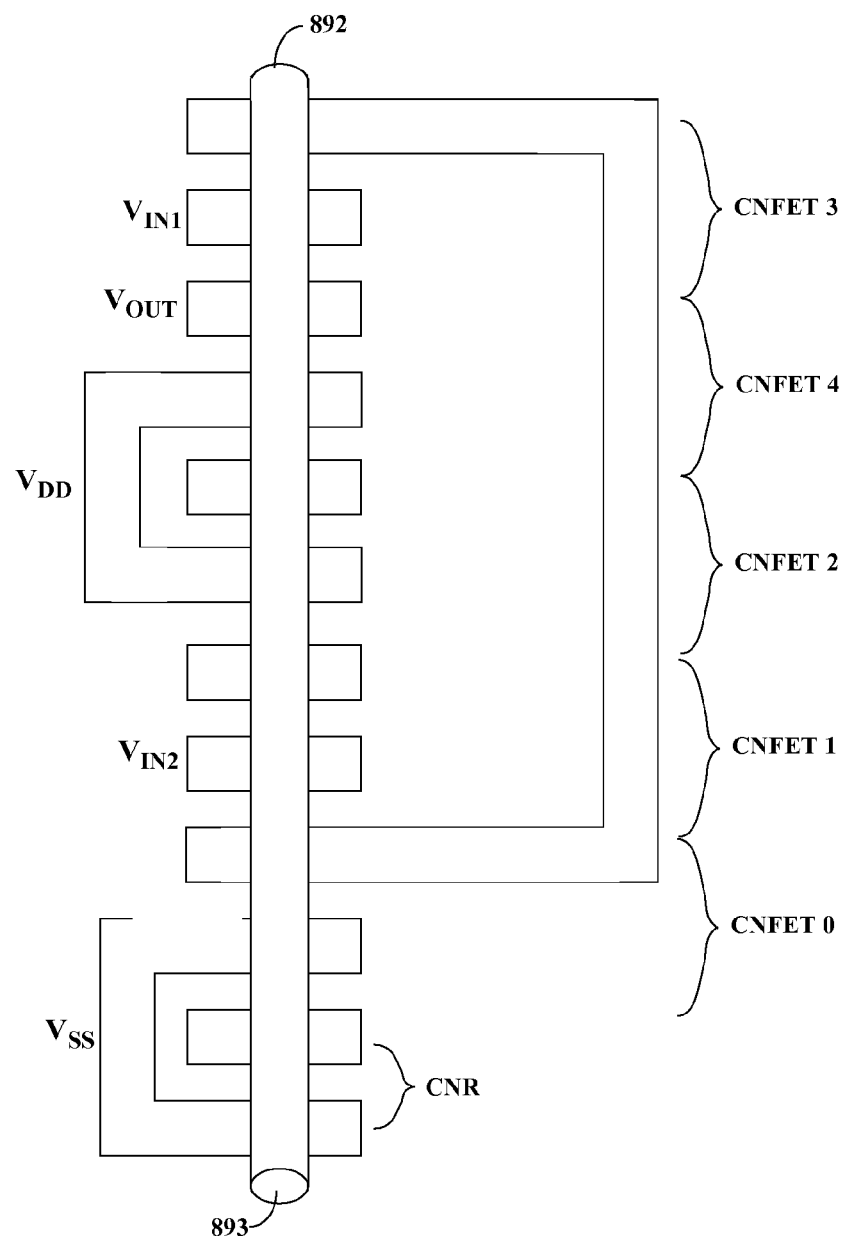
FIG. 8b shows one of the two carbon nanotube segment implementations of the exemplary two-stage linear differential amplifier circuit depicted in FIG. 5a sharing the same carbon nanotube between the current source and one of the differential input and active load strings of the differential amplifier.

FIG. 8b shows one of the two carbon nanotube segment implementations of the two-stage linear differential amplifier circuit depicted in FIG. 5a sharing the same carbon nanotube between the current source and one of the differential input and active load strings of the differential amplifier. In FIG. 8b, as with FIG. 7a, gate insulation layers used to create the CNFETs, and oxygen management layers used to realize the complementary CNFETs, are not shown to simplify the drawing. These are readily accounted for according to the needs of each component by one skilled in the art following the arrangement of FIG. 7c from FIGS. 7a and 7b.

The result, however, is quite advantageous and perhaps surprising—an entire analog differential amplifier created from a single carbon nanotube! This arrangement has many advantages, among these being ease of fabrication, natural advantages in matching the pair of CNFETs used as the differential pair, and natural advantages in matching the pair of CNFETs used as the active loads. Additional advantages will be subsequently demonstrated.

Figure 8C:
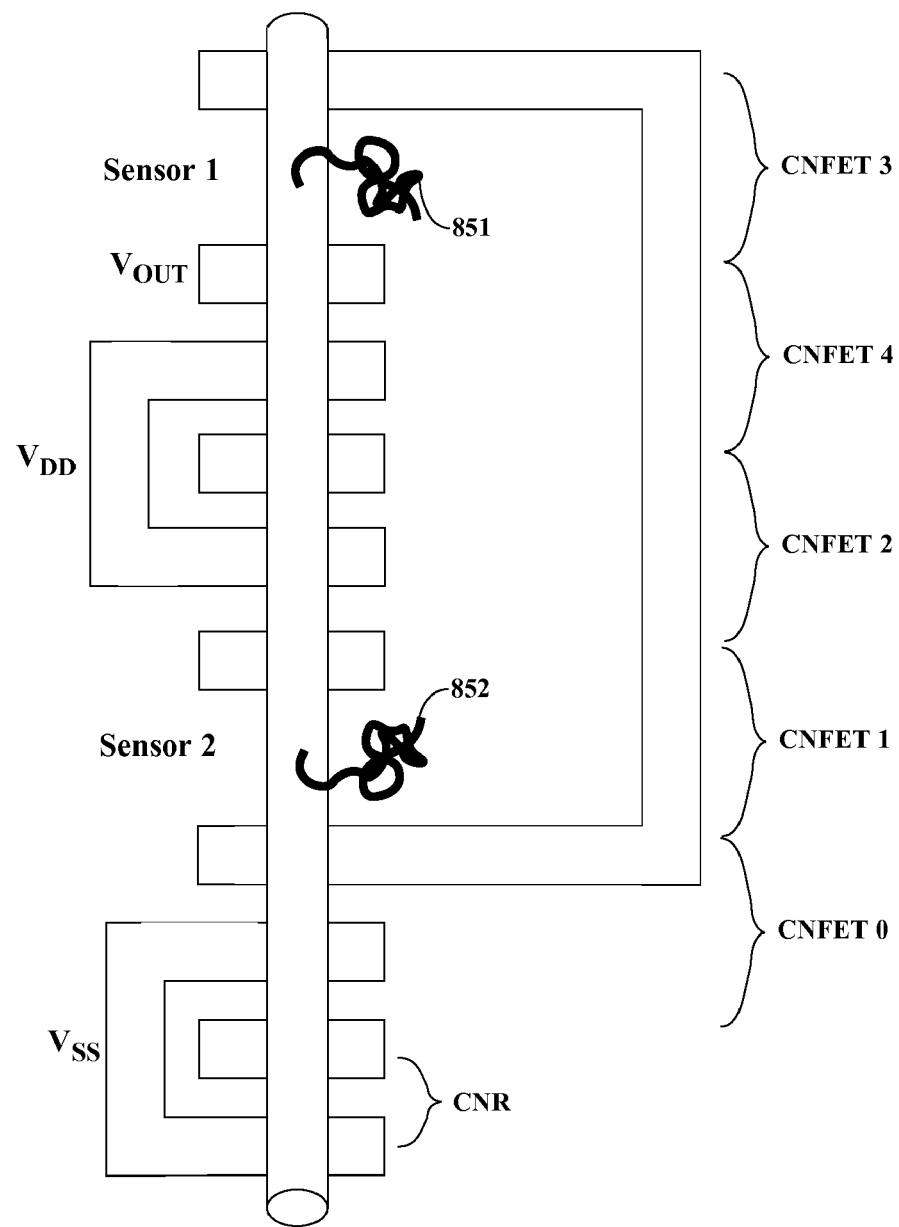
FIG. 8c illustrates a variation of FIG. 8b wherein both input CNFETs have been replaced with an affinity carbon nanotube sensor.

Additionally, various embodiments of the invention provide, in the manner described before, for either or both of CNFET1 and/or CNFET3 to be replaced with an appropriate carbon nanotube sensor. For example, FIG. 8c illustrates a variation of FIG. 8b wherein both CNFET1 and/or CNFET3 have been replaced with an affinity carbon nanotube sensor. The two affinity sensors 851, 852 may include the same affinity molecule to make a spatially differential measurement, or be variations of each other, such as the chirality suggested in the figure, or more dissimilar affinity molecules. As another example, either or both of CNFET CNFET1 and/or CNFET3 may be replaced with an appropriate optical sensing carbon nanotube sensor or optical sensing CNFET.

Still further, either or both of the active load CNFET2 and/or CNFET4 may be replaced with an appropriate optical sensing carbon nanotube sensor or optical sensing FET. Either or both of these optical sensing and optical emitting CNFET arrangements allow for optical signal interconnections among carbon nanotube segments, within regions of the same carbon nanotube, or signal connections with external systems. A number of simply realized optical sensing CNFETs and optical emitting CNFET have been reported, for example those by General Electric Global Research as reported in http://nanotechweb.org/cws/article/tech/19870 and Applied Physics Letters 87,073101, Aug. 8, 2005.

Attention is now returned to techniques used to effectively connect pairs of circuit segments and render both with a common carbon nanotube. With reference to FIG. 7a, one way to view the result of FIG. 8b is that:

the lower end 793 of the lower of the three carbon nanotube segments can be implemented as the lower end 893 of the single carbon nanotube of FIG. 8b;

the lower end 792 of the rightmost of the three carbon nanotube segments can be implemented as the upper end 892 of the single carbon nanotube of FIG. 8b;

the lower end 791 of the leftmost of the three carbon nanotube segments can be implemented as connected to or extended through to the upper end 783 of the lower of the three carbon nanotube segments;

the upper end 781 of the leftmost of the three carbon nanotube segments can be implemented as connected to or extended through to the upper end 782 of the rightmost of the three carbon nanotube segments.

However, various embodiments are often such that the ends of the carbon nanotubes or carbon nanotube segments depicted in FIGS. 6b, 7a, 7b, 7c, 8b, and 8c are electrically active and in general cannot be freely connected together to effectively "join" separate nanotube segments without changing the circuit. Such "joining," or continuing interconnection, among a given pair of nanotube segments will typically permit leveraging electrical connections between them.

As has been demonstrated, however, a single carbon nanotube can be shared to serve the roles of two carbon nanotube segments if the ends of these two segments share an electrical contact or other direct electrical interconnection.

Further, as demonstrated herein, this can be sequentially repeated to string together as many admissible pairwise sharings as there are available in the circuit. For the purposes of this disclosure, this arrangement will be referred to as a "carbon nanotube sharing principle." The carbon nanotube sharing principle also provides a design technique in that, much like the so-called silicon "IP-cores" in silicon-based "System-on-a-Chip" formalisms and commercial marketplaces, one or more carbon nanotube designs for libraries of individual subsystems that can be separately designed and realized. Such arrangements may be implemented in advance and as "nanotube IP-core" products for a "System-on-a-Nanotube" marketplace. The design for each such nanotube IP-core may also be made available as abstracted as a graph for computer manipulation to present various nanotube segment-joining or other inter-segment electrical or optical interconnection opportunities, among other uses.

Figure 9A:
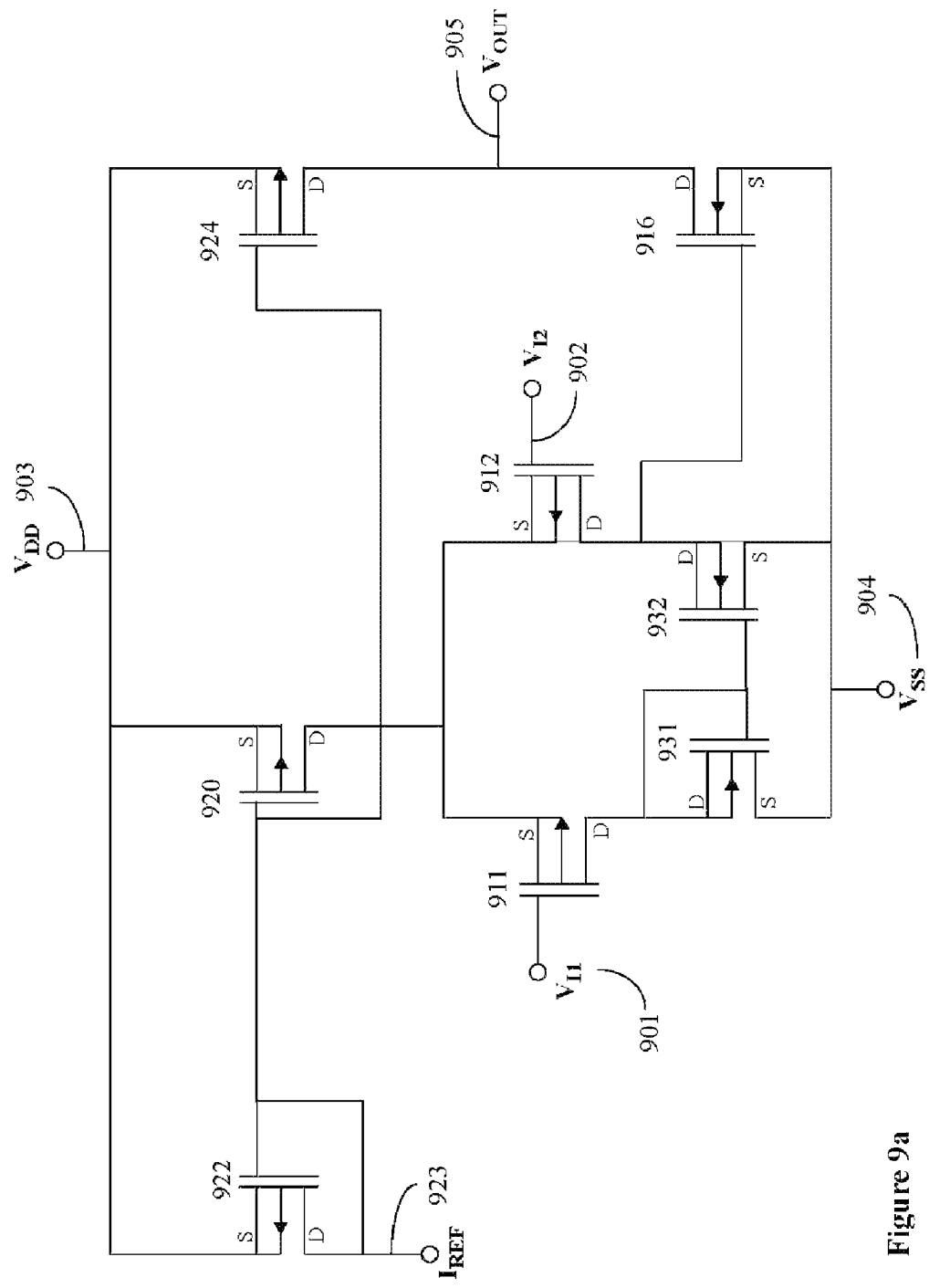
FIG. 9a shows an exemplary two-stage linear differential amplifier circuit realized with field-effect transistors, and employing active load transistors that may be adapted for implementation with complementary carbon nanotube field-effect transistors.

As indicated earlier, differential amplifiers can be ganged in cascades or further amplified in other ways to produce operational amplifiers which in turn can be used to implement a wide variety of sophisticated functions useful for interfacing with sensors and other circuits. FIG. 9a shows an exemplary two-stage linear differential amplifier circuit realized with field-effect transistors, and employing active load transistors that may be adapted for implementation with complementary carbon nanotube field-effect transistors. This circuit employs a current mirror to replicate and distribute a provided reference current $I_{REF}$. This provided reference current $I_{REF}$ may be supplied from constant current sources, as described earlier.

Figure 9B:
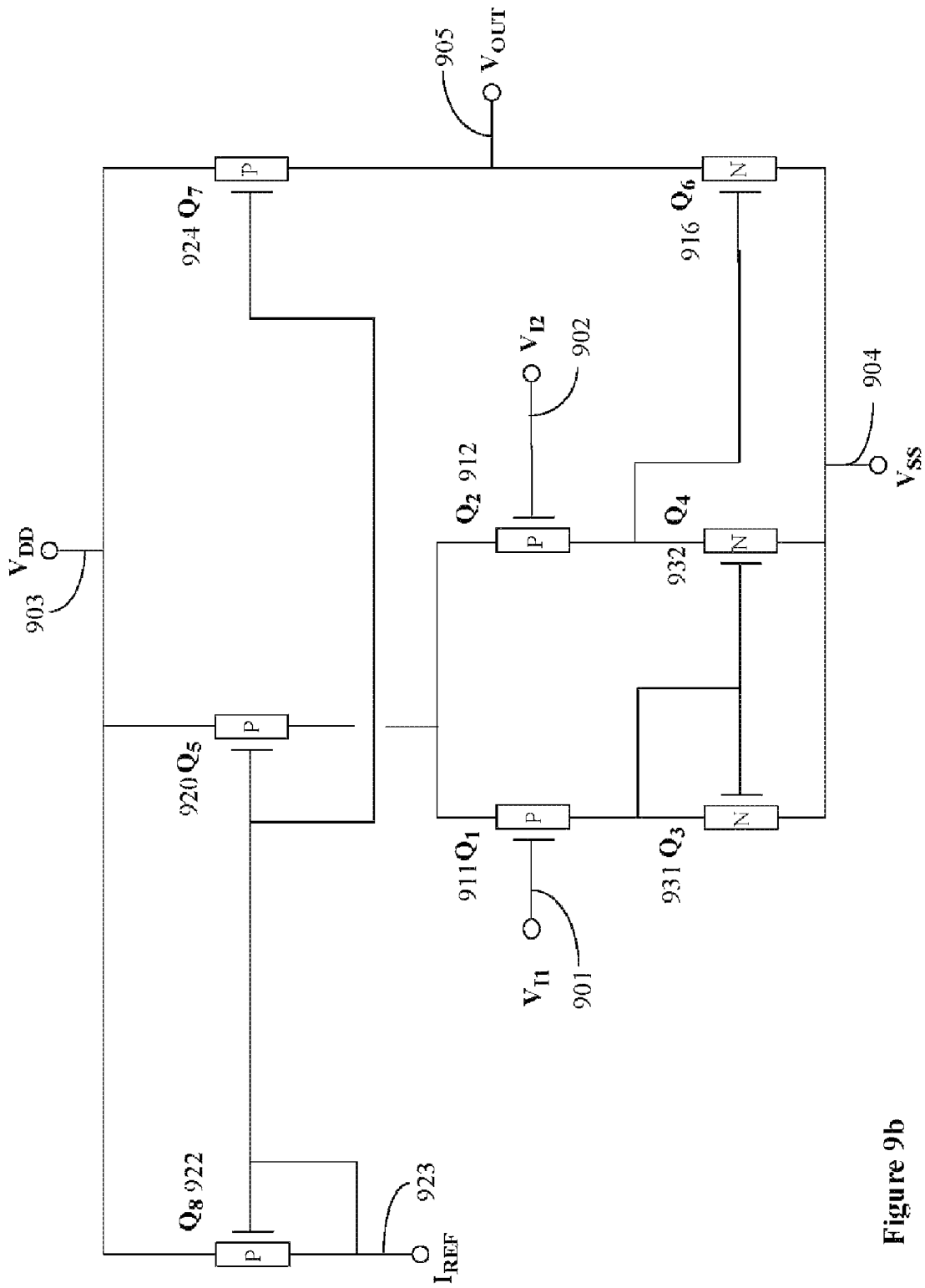
FIG. 9b shows the circuit of FIG. 9a implemented with various N-type and P-type MOSFETs as being replaced by corresponding N-type and P-type CNFETs.
Figure 9C:
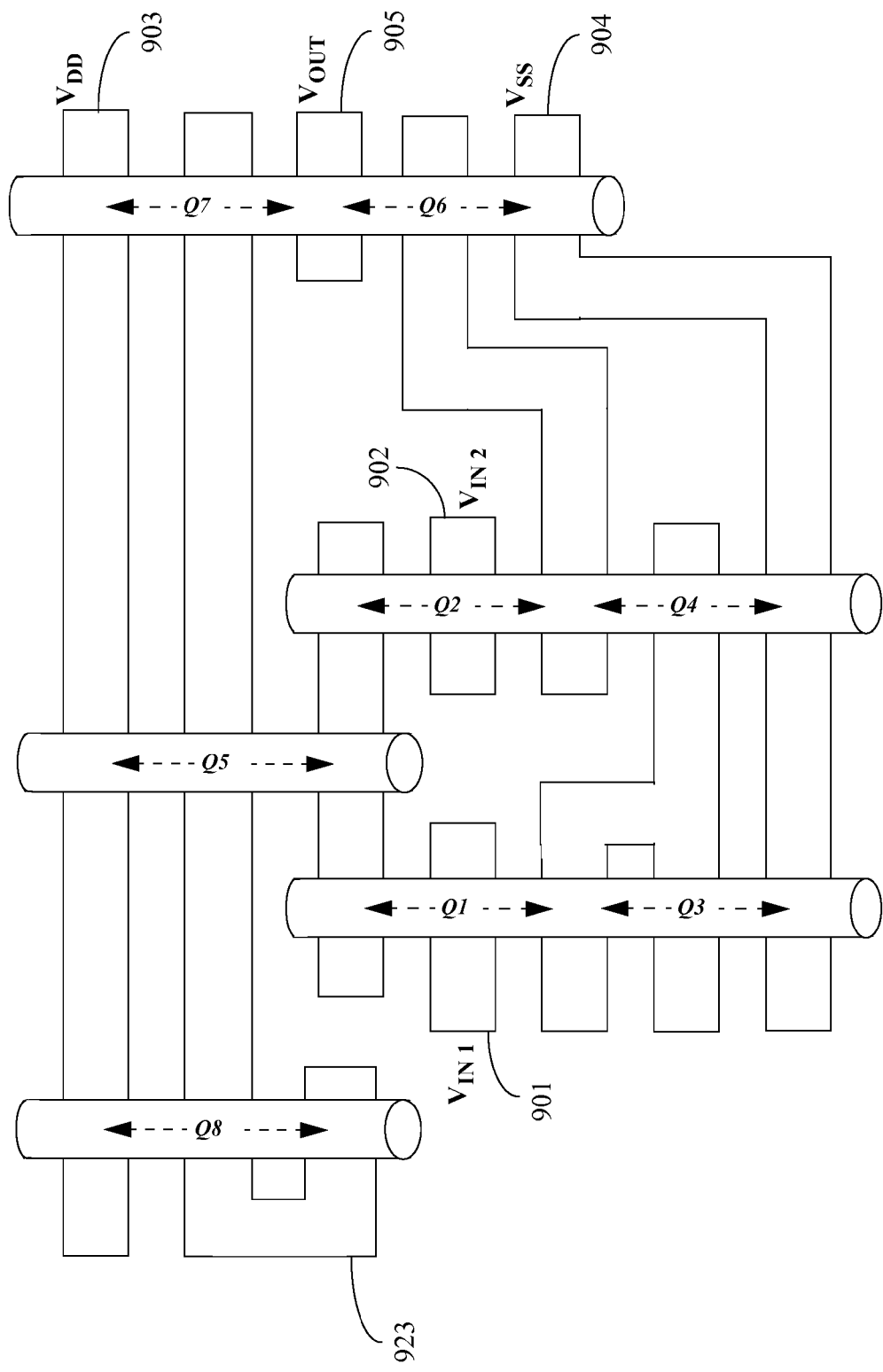
FIG. 9c depicts an exemplary five carbon nanotube implementation of the exemplary two-stage linear differential amplifier circuit depicted in FIG. 9b.

FIG. 9b shows the circuit of FIG. 9a with various N-type and P-type MOSFETs being replaced with corresponding N-type and P-type CNFETs. Employing the techniques developed thus far in conjunction with the examples depicted in FIGS. 6b, 7b and 8b, a generalized carbon nanotube implementation of an exemplary two-stage linear differential amplifier circuit depicted in FIG. 9b can be realized, for example, as in the five carbon nanotube implementation depicted in FIG. 9c. In a similar fashion, other types of analog operational amplifier circuits and other analog electronic circuits may be implemented with carbon nanotubes in similar fashion. In one embodiment, a long-tailed pair configuration may be used for stand alone differential amplifiers or as differential amplifier segments of operational amplifiers. In many situations, the described carbon nanotube sharing principle may be used quite advantageously to reduce the number of carbon nanotubes required.

Figure 10A:
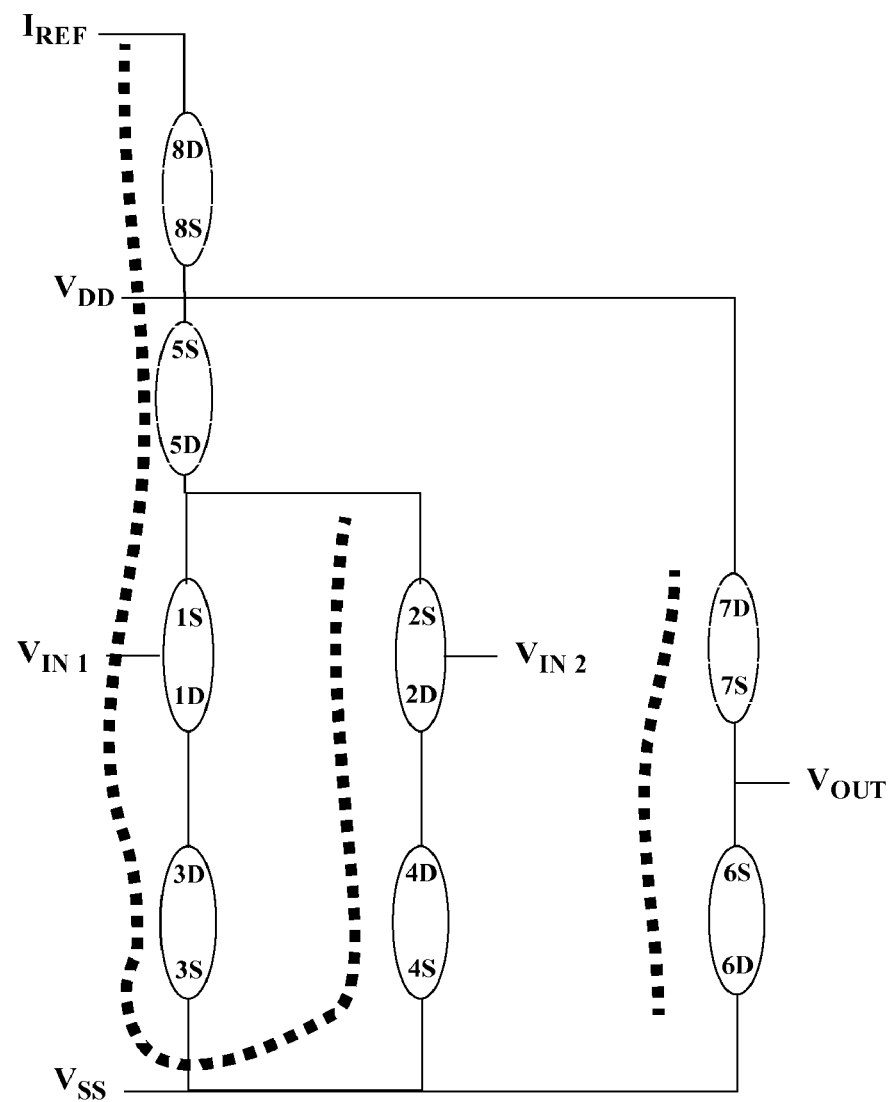
FIG. 10a shows a topological diagram of source and drain interconnections among the CNFETs of the circuit of FIG. 9b.

As an example, FIG. 10a shows a topological diagram of the source and drain interconnections among the CNFETs of the circuit of FIG. 9b. The layout can be organized in various trial configurations to identify opportunities to (1) sequence individual components into nanotube segments, and (2) review nanotube segments to combine nanotubes. FIG. Iob shows the result of applying the results of FIG. 10a in order to provide a two nanotube realization.

Figure 11A:
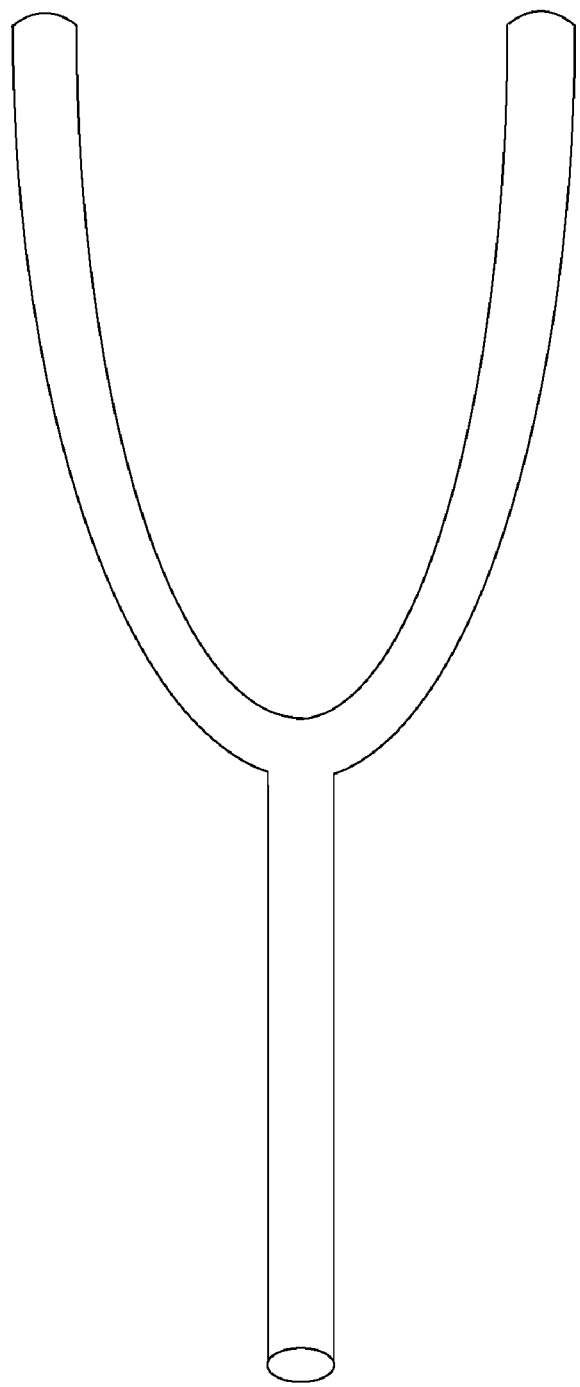
FIG. 11a depicts a carbon nanotube with a "Y" structure.

Carbon nanotubes with a "Y" structure, which will be referred to as a "Y" carbon nanotube, depicted in FIG. 11a, have also been shown to be easy to fabricate and have a number of additional electrical properties. As an example, a Y carbon nanotube may be used to produce various alternate types of carbon nanotube transistors such as those described by Knight in "Y-shaped Nanotubes are Ready-made Transistors," NewScientist.com, pgs. 1-2, Jan. 29, 2007, available at http://www.newscientist.com/article.ns?id=dn7847. It is also possible to use the Y carbon nanotube strictly for its topological structure at a circuit lay-out level. For example, it has been demonstrated that a Y carbon nanotube can be used to fabricate a two-input logic gate. An example of this is described by in a publication by Gojman, B., Hsin, H., Liang, J., Nezhdanova, N., and Saini, Jasmin, in a publication entitled "YJunction Carbon Nanotube Implementation of Intramolecular Electronic NAND Gate," Aug. 13, 2004, pg. 1-24.

Figure 11B:
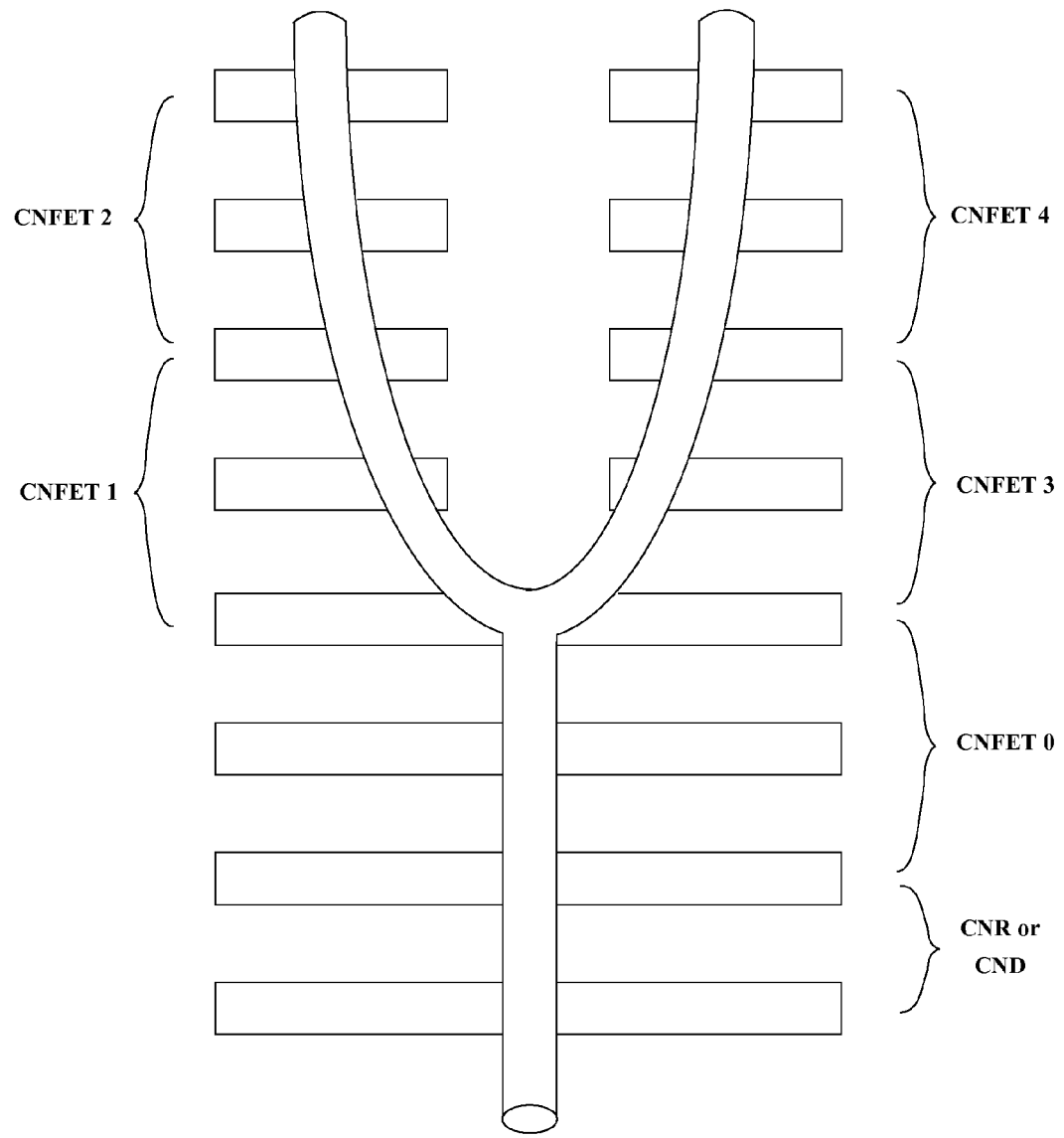
FIG. 11b shows one technique for locating electrodes beneath the "Y" carbon nanotube to create environments for the carbon nanotube field effect transistors used in the circuits of FIGS. 5a through 5c.

Various embodiments use the geometric and topological properties of a Y carbon nanotube to realize a single Y carbon nanotube implementation of the circuits of FIGS. 5a through 5c. To begin, FIG. 11b shows one technique for locating electrodes beneath the Y carbon nanotube to create environments for the carbon nanotube field effect transistors used in the circuits of FIGS. 5a through 5c. As described repeatedly in previous examples, it is noted that either or both of CNFETI or CNFET3 may be replaced with carbon nanotube sensors.

Figure 11C:
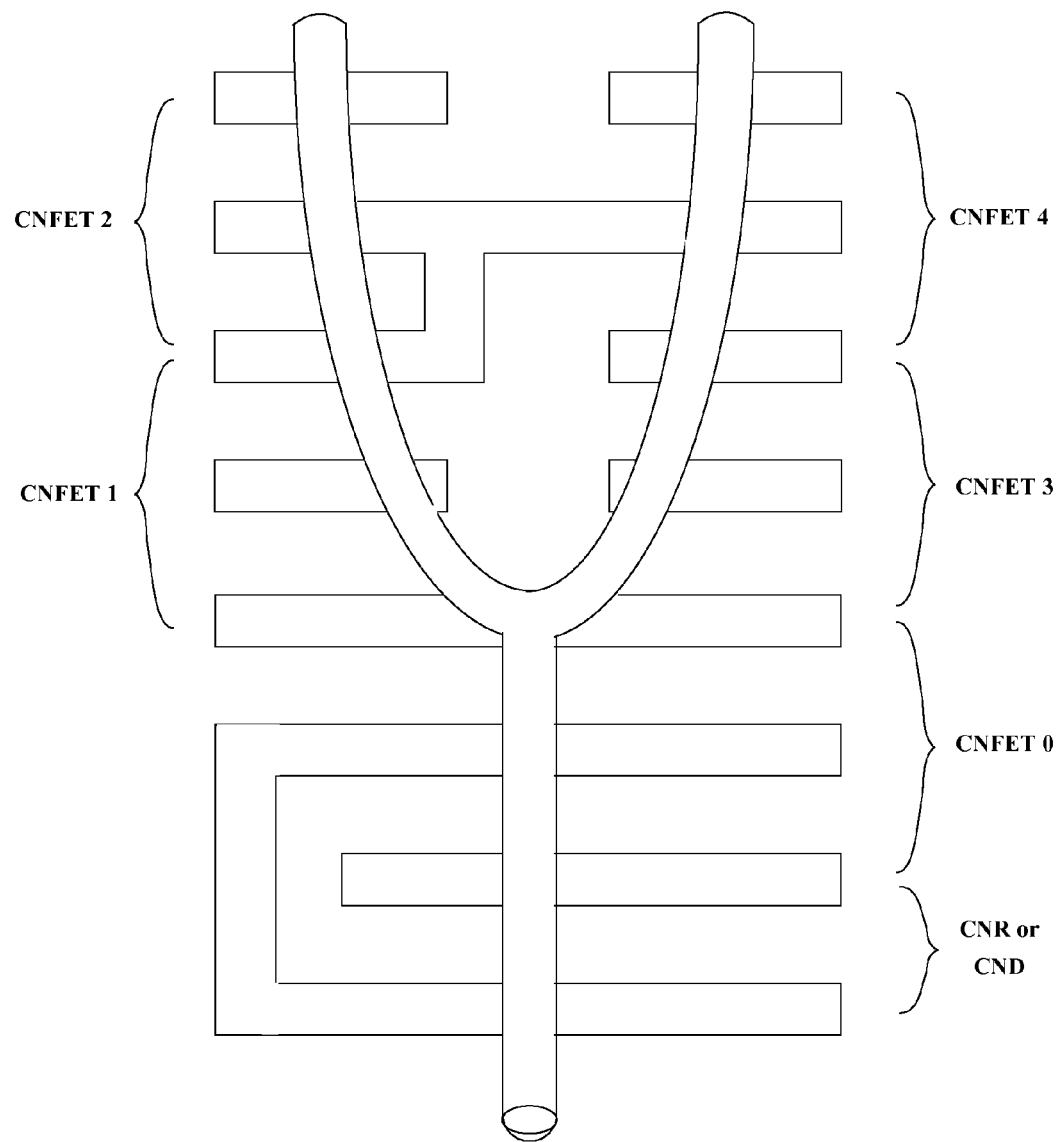
FIG. 11c shows interconnections of the contacts beneath a "Y" carbon nanotube to realize the circuits of FIGS. 5a through 5c.

FIG. 11c shows interconnections of the contacts beneath a Y carbon nanotube to realize the circuits of FIGS. 5a through 5c. In FIG. 11c, as with FIGS. 7a and 8b and other figures described herein, gate insulation layers used to create the CNFETs and oxygen management layers used to realize complementary CNFETs are not shown to simplify the drawing. These are readily are accounted for according to the needs of each component by one skilled in the art or one following the example of FIG. 7c rendered from FIGS. 7a and 7b. Again, the CNFET1 or CNFET3 or both may be replaced with carbon nanotube sensors and/or active loads CNFET2 or CNFET4 or both to be carbon nanotube optical emitting CNFETs. Accordingly, these Y carbon nanotube electronic circuits may have electrical signal interconnections with other circuits via connecting contacts and/or optical signal interconnection as described in conjunction with FIG. 7d.

Attention is now directed to the use of carbon nanotube differential amplifiers and more complex carbon nanotube operational amplifiers such as the example described in conjunction with FIGS. 9b, 9c, 10a, and 10b, in creating more sophisticated circuits for use in interfacing with other carbon nanotube sensors, actuators, transducers, and other types of nanoscale systems.

When implemented with sufficiently high open-loop gain, carbon nanotube differential amplifiers and carbon nanotube operational amplifiers may be used as comparators. In one embodiment, a differential amplifier may be used as a comparator for use in converting analog-valued electrical signals to binary-valued electrical signals, other signals, event symbols, and the like. Alternatively, a plurality of comparators may be used to convert analog-valued electrical signals to digitally-valued electrical signals, other signals, and event symbols, among others. Further, a plurality of comparators with adequately well-defined output voltage or current values may be used to convert digitally-valued electrical signals, other signals, event symbols, and the like, to analog-valued electrical signals.

Additionally, the differential input arrangement of the differential amplifier provides a basic structural and operational block that is very useful for creating feedback structures, particularly negative feedback. FIGS. 12a through 12h, 13a, 13b, 14, 15a, 15b, and 15c illustrate a number of exemplary realizations of basic functional signal processing building blocks that employ negative feedback that is made possible by a differential input arrangement of the differential amplifier, both in isolation and as the front end for operational amplifier elements as described in conjunction with FIGS. 9b, 9c, 10a, and 10b. The circuits depicted in FIGS. 12a through 12h, 13a, 13b, 14, 15a, 15b, 15c and many variations of thereof as will be understood by one skilled in the art of analog circuit design.

In some applications, the indigenous gain of a simple differential amplifier may be sufficient for realizing the associated functional signal processing building block. In FIGS. 12a through 12h, 13a, 13b, 14, 15a, 15b, and 15c, and many variations thereof, the standard triangle with two signed inputs and a single output is used with the understanding that it may be implemented as either a carbon nanotube differential amplifier or a higher-gain carbon nanotube operational amplifier element.

Figure 12A:
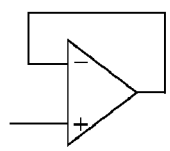
FIGS. 12a through 12h depict exemplary analog signal processing circuits that may be realized with either a carbon nanotube differential amplifier or a higher-gain carbon nanotube operational amplifier element.

FIG. 12a shows an exemplary unity gain amplifier realized through use of 100% negative feedback that may be realized with either a carbon nanotube differential amplifier or higher-gain carbon nanotube operational amplifier element. The direct-connection between output and inverting input may be substituted with a resistive or other type of voltage divider to produce higher gains as will be understood by one skilled in the art of analog circuit design. Such an arrangement has a gain that is the reciprocal of the voltage division ratio.

Figure 12B:
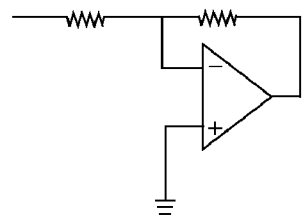

FIG. 12b shows an exemplary inverting amplifier whose gain is set by the ratio of input and feedback resistors.

Figure 12C:
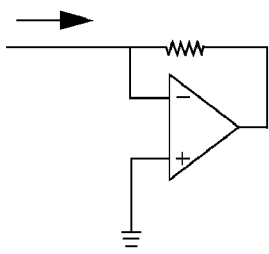

FIG. 12c shows an exemplary current to voltage converter whose transconducting gain is set by the feedback resistor.

Figure 12D:
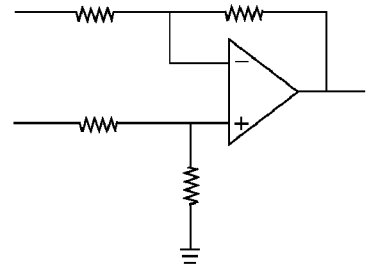

FIG. 12d shows an exemplary differencing amplifier whose respective inverting and non-inverting gains are set by the values of input and feedback resistors.

Figure 12E:
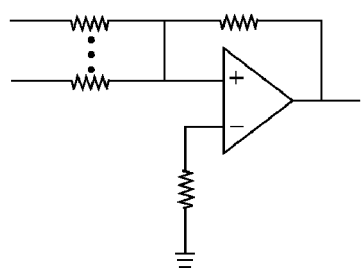

FIG. 12e shows an exemplary inverting amplifier whose gain is set by the ratio of input and feedback resistors.

Figure 12F:
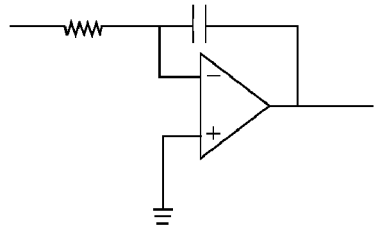

FIG. 12f shows an exemplary integrator whose integration constant (or gain) is set by the product of input resistor and feedback loop capacitor. For small capacitance values, for example, the depicted capacitor may be realized directly by carbon nanotube regions (as the capacitive elements described in conjunction with the discussion regarding FIG. 6b) or directly from a capacitive element realized by metallization regions separated by a dielectric insulating layer. For large capacitance values, the depicted capacitor may be realized using the above described capacitive element supplemented with a capacitive multiplying circuit.

Figure 12G:
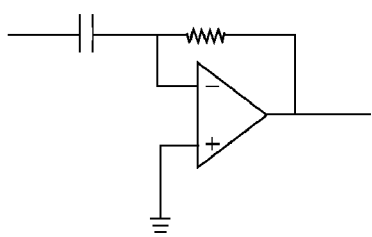

FIG. 12g shows an exemplary differentiator whose gain is set by the product of an input capacitor and a feedback resistor. In some implementations this circuit is adequate, while in others the performance of the circuit of FIG. 12g may be inadequate. In the later case, a so-called "practical differentiator" comprising additional high-frequency handling may be used.

Figure 12H:
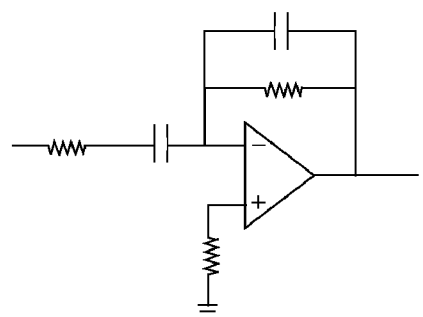

FIG. 12h shows an exemplary realization of a "practical differentiator." The circuit of FIG. 12h may also be adapted to act as a bandpass filter for a range of component value choices.

Figure 13A:
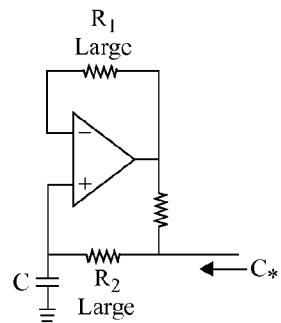
FIGS. 13a and 13b depict exemplary capacitor multiplier circuits that may be realized with either a carbon nanotube differential amplifier or higher-gain carbon nanotube operational amplifier element.
Figure 13B:
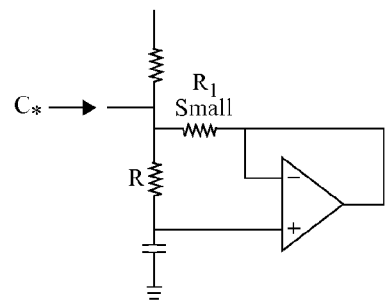

FIGS. 13a and 13b each depict exemplary realizations of capacitor multipliers than can be used to multiply the value of a small capacitor. Multiplication factors of 1,000 and beyond are typically attainable with these and related types of circuits, with performance usually limited by leakage currents. The circuits of FIGS. 13a and 13b depict capacitive multipliers for grounded capacitors. Various approaches exist for implementing the floating capacitors such as those shown in FIGS. 12f through 12h; for an overview and new approaches see for example M. Siripruchyanan and W. Jaikla, "Floating capacitance multiplier using DVCC and CCCIIs," ISCIT '07 International Symposium On Communications and Information Technologies, Oct. 17-19, 2007, Sydney, pp. 218-221 and W. Petchakit and S. Petchakit, "New Floating Capacitance Multipliers," presented at EECON-28, available at http://www.siam.edu/su-doc/EL-041.pdf. The circuits therein may be adapted to realizations with CNFETs and other carbon nanotube components using various methods disclosed herein. Alternatively, realizations employing grounded capacitors may be used where available.

Figure 14:
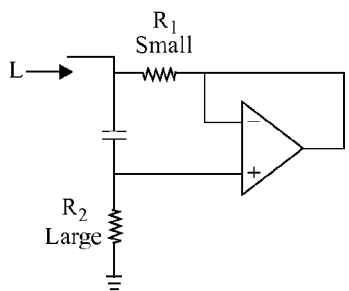
FIG. 14 depicts an exemplary realization of a gyrator applied to a small-valued capacitor than can be used to implement inductance, which may be realized with either a carbon nanotube differential amplifier or a higher-gain carbon nanotube operational amplifier element.

FIG. 14 depicts an exemplary realization of a gyrator applied to a small-valued capacitor that can be used to implement inductance. Relatively large inductances are typically attainable with these and related types of circuits, with performance usually limited by leakage currents.

Figure 15A:
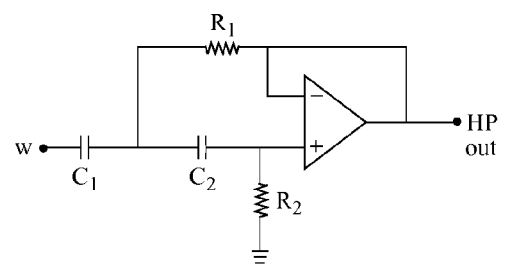
FIGS. 15a through 15c show exemplary circuits for various types of analog signal filters that may be realized with either a carbon nanotube differential amplifier or a higher-gain carbon nanotube operational amplifier element.

A plethora of low-pass, bandpass, and high-pass filters employing feedback amplifiers are known. The simplest employ simple RC filters, such as a twin-T, supplemented by unity gain amplifiers. FIG. 15a depicts a two-pole high-pass filter which makes more sophisticated use of a single negative feedback amplifier. If desired, a twin-T filter with grounded inductors and in-line resistors can be realized using the circuit such as that of FIG. 14 with a subsequent buffer amplifier employing for example the arrangement of FIG. 12a or its described variants.

Figure 15B:
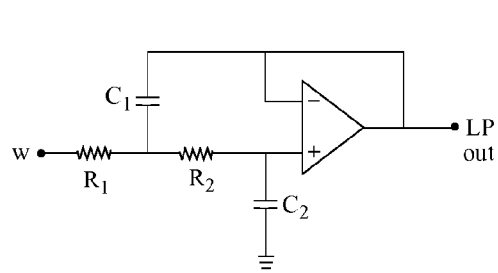

FIG. 15b depicts a two-pole low-pass filter which makes sophisticated use of a single negative feedback amplifier. If desired, a twin-T filter with grounded capacitors and in-line resistors can be realized using capacitive elements described earlier or the capacitive multiplier circuits such as those of FIG. 13a or 13b with a subsequent buffer amplifier employing for example the arrangement of FIG. 12a or its described variants.

Figure 15C:
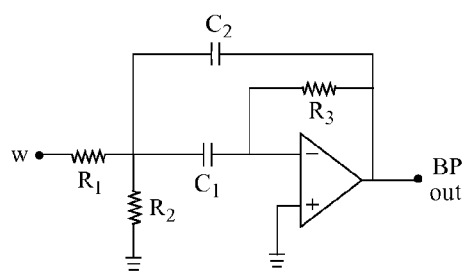

FIG. 15c depicts an exemplary bandpass filter with floating capacitors. Such a circuit and many variations on it may be realized with either a carbon nanotube differential amplifier or higher-gain carbon nanotube operational amplifier element. This arrangement is particularly useful when small capacitive values can be used.

Figure 16:
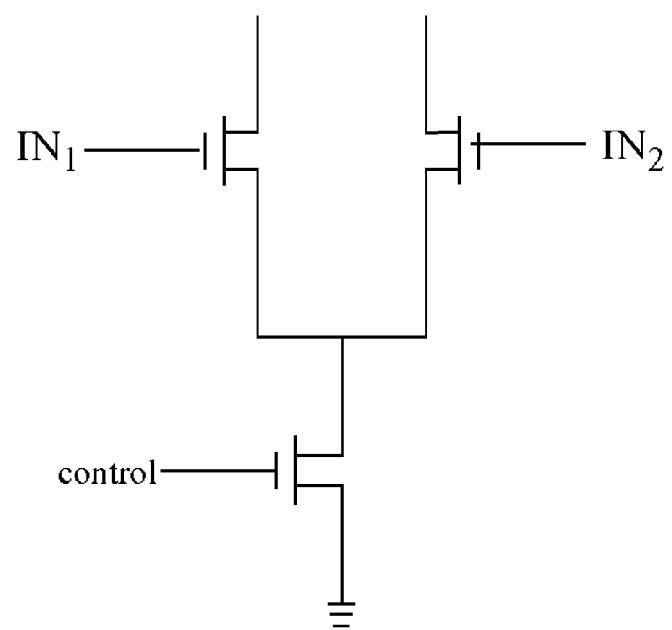
FIG. 16 depicts an exemplary structure for realizing signal multiplication and operational transconductance amplifiers from CNFETs.

It is also possible to vary the current into a differential pair of CNFETs using at least a third CNFET as a voltage-controlled current source. Within some limits the resulting configuration, such as the exemplary one depicted in FIG. 16, can provide a signal multiplication function associated with operational transconductance amplifiers such as the CA3080, CEM3360, and their relatives, decedents, and competitors. According to various embodiments, the CNFET implementations of signal multiplier elements is thus provided for by the invention. See for example "RCA Linear Integrated Circuits," RCA Corporation, Somerville, 1970 for a treatment of operational transconductance amplifiers from the bipolar transistor viewpoint.

It is also possible to apply these techniques to other types of specialized analog circuits, for example analog distributed amplifiers. The latter can be expected to provide and exploit synergies involving small physical size, repetitive structure, and high frequency operation.

While the invention has been described in detail with reference to disclosed embodiments, various modifications within the scope of the invention will be apparent to those of ordinary skill in this technological field. It is to be appreciated that features described with respect to one embodiment typically may be applied to other embodiments. Therefore, the invention properly is to be construed with reference to the claims.

I claim:

1. An apparatus comprising:
   a graphene nanoribbon having a chain of electronic components formed therein, wherein the chain of electronic components includes:
      first and second transistors formed in the graphene nanoribbon, wherein the first and second transistors are configured to act as input transistors of a differential amplifier; and
      a third transistor formed in the graphene nanoribbon and configured to operate as a current source, wherein the current source is configured to draw current through the first and second transistors, and wherein the third transistor is physically adjacent to the first transistor.

2. The apparatus of claim 1, wherein each of the first, second, and third transistors includes a respective gate terminal that is electrically insulated from the graphene nanoribbon and is configured to exert an electric field on the graphene nanoribbon.

3. The apparatus of claim 2, wherein the first transistor is coupled to receive a first portion of a differential input signal on its respective gate terminal, and wherein the second transistor is coupled to receive a second portion of a differential input signal on its respective gate terminal, wherein the apparatus is configured to produce a differential output signal based on the first and second portions of the differential input signal.

4. The apparatus of claim 1, further comprising an active load formed in the graphene nanoribbon between the first and second transistors;

wherein the active load includes fourth and fifth transistors formed in the graphene nanoribbon, wherein the fourth and fifth transistors are physically adjacent to one another.

5. The apparatus of claim 4, wherein the fourth transistor is electrically coupled to and physically adjacent to the first transistor, and wherein the fifth transistor is electrically coupled to and physically adjacent to the second transistor.

6. The apparatus of claim 4, further comprising a first electrical conductor coupled to the graphene nanoribbon, wherein the first transistor, the second transistor, and the third transistor each include a respective terminal coupled to the first electrical conductor.

7. The apparatus of claim 6, further comprising a second electrical conductor coupled to respective gate terminals of the fourth and fifth transistors.

8. The apparatus of claim 7, further comprising a third electrical conductor coupled to respective drain terminals and to the respective gate terminals of the fourth and fifth transistors, wherein the third electrical conductor is electrically coupled to the graphene nanoribbon.

9. The apparatus of claim 8, further comprising fourth and fifth electrical conductors coupled to the respective gate terminals of the first and second transistors, respectively, wherein the fourth and fifth electrical conductors are electrically insulated from the graphene nanoribbon.

10. The apparatus of claim 1, further comprising a resistor formed in the graphene nanoribbon, wherein the resistor is electrically coupled between the third transistor and a ground node.

11. An apparatus comprising:
a graphene nanoribbon having a chain of electronic components formed therein, wherein the chain of electronic components includes:
first and second sensors formed the graphene nanoribbon, wherein the first and second sensors form a differential circuit;
a first transistor formed in the graphene nanoribbon and configured to operate as a current source, wherein the current source is configured to draw current through the first and second sensors wherein the first transistor is physically adjacent to the first sensor.

12. The apparatus of claim 11, further comprising second and third transistors formed in the graphene nanoribbon, wherein the second and third transistors are physically arranged in the graphene nanoribbon between the first and second sensors.

13. The apparatus of claim 12, wherein the first sensor is physically adjacent to the first transistor and the second transistor, and wherein the second sensor is physically adjacent to the third transistor and an end of the graphene nanoribbon.

14. The apparatus of claim 12, wherein the second and third transistors each include respective gate terminals coupled to a power node, and wherein the second and third transistors are configured to provide an active load for the differential circuit.

15. The apparatus of claim 12, further comprising a first electrical conductor coupled between the first transistor, the first sensor, and the second sensor, wherein the first electrical conductor is external to the graphene nanoribbon.

16. The apparatus of claim 15, further comprising a second electrical conductor coupled to respective gate terminals of the second and third transistors and further coupled to a power node.

17. The apparatus of claim 11, further comprising a resistor formed in the graphene nanoribbon, wherein the resistor is physically adjacent to the first transistor and an end of the graphene nanoribbon.

18. The apparatus of claim 11, wherein the first and second sensors are optical sensors.

19. An apparatus comprising:
a graphene nanoribbon having a chain of electronic components formed therein, wherein the chain of electronic components includes:
first and second transistors formed in the graphene nanoribbon, wherein the first and second transistors are physically adjacent to one another;
a third transistor formed in the graphene nanoribbon and physically adjacent to the first transistor, the third transistor configured to receive an electrical input signal; and
first and second devices formed in the graphene nanoribbon, wherein the first device is physically adjacent to each of the first transistor and the third transistor, and wherein the second device is physically adjacent to the second transistor and a first end of the graphene nanoribbon.

20. The apparatus of claim 19, wherein first and second devices are fourth and fifth transistors, respectively.

21. The apparatus of claim 20, wherein the fourth transistor is coupled to receive a first portion of a differential input signal, wherein the fifth transistor is coupled to receive a second portion of a differential input signal, and wherein the apparatus is configured to produce a differential output signal based on the differential input signal.

22. The apparatus of claim 19, wherein the third transistor is configured to act as a current source.

23. The apparatus of claim 19, wherein the first and second devices are first and second sensors, respectively.

24. The apparatus of claim 23, wherein the first and second sensors are optical sensors.

25. The apparatus of claim 19, wherein the third transistor is electrically coupled to the first transistor, wherein the first device is electrically coupled between the first transistor and the third transistor, and wherein the second device is electrically coupled between the second transistor and the third transistor.

26. The apparatus of claim 19, wherein each of the first and second transistors includes a respective gate terminal coupled to a power node.

* * * * *

UNITED STATES PATENT AND TRADEMARK OFFICE
CERTIFICATE OF CORRECTION

PATENT NO. : 8,324,555 B2
APPLICATION NO. : 13/217240
DATED : December 4, 2012
INVENTOR(S) : Ludwig It is certified that error appears in the above-identified patent and that said Letters Patent is hereby corrected as shown below:

On the Title Page, Item (57), under "ABSTRACT", in Column 2, Line 7, delete "on, the" and insert -- on the --, therefor.

In the Specification:

In Column 2, Line 12, delete "("CFFET")." and insert -- ("CNFET"). --, therefor.

In Column 2, Line 16, delete "("CFFET")." and insert -- ("CNFET"). --, therefor.

In Column 5, Line 45, delete "13 17-1320." and insert -- 1317-1320. --, therefor.

In Column 7, Line 61, delete "FIGS. Ia-Ib," and insert -- FIGS, 1a-1b, --, therefor.

In Column 8, Line 51, delete "there" and insert -- their --, therefor.

In Column 10, Line 36, delete "complementarytyped" and insert -- complementary typed --, therefor.

In Column 14, Line 48, delete "CNFETI" and insert -- CNFET1 --, therefor.

In Column 14, Line 51, delete "CNFETI" and insert -- CNFET1 --, therefor.

In Column 14, Line 61, delete "CNFET CNFET1" and insert -- CNFET, CNFET1 --, therefor.

In Column 16, Line 39, delete "fieely" and insert -- freely --, therefor.

Figure 10B:
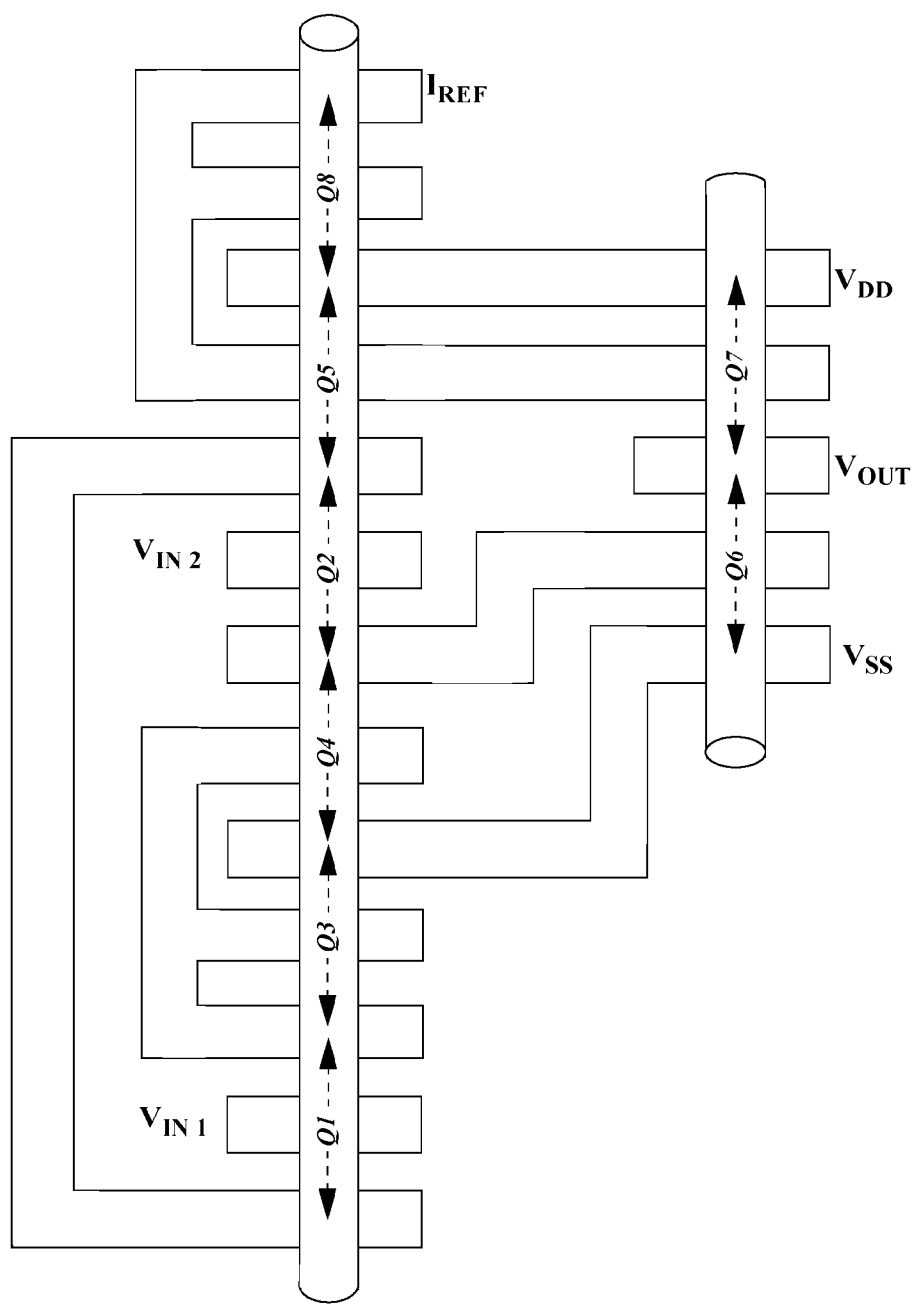
FIG. 10b shows a result of applying the results of FIG. 10a to realize a two nanotube realization.

In Column 17, Line 33, delete "FIG. Iob" and insert -- FIG. 10b --, therefor.

In Column 17, Line 61, delete "CNFETI" and insert -- CNFET1 --, therefor.

Signed and Sealed this
Seventeenth Day of September, 2013

Teresa Stanek Rea
*Deputy Director of the United StatesPatent and Trademark Office*

CERTIFICATE OF CORRECTION (continued)
U.S. Pat. No. 8,324,555 B2

In Column 20, Lines 20-21, delete "for by the" and insert -- by the --, therefor.

In the Claims:

In Column 21, Line 35, in Claim 11, delete "formed the" and insert -- formed in the --, therefor.

In Column 21, Line 41, in Claim 11, delete "sensors" and insert -- sensors, --, therefor.